US012284760B2

(12) United States Patent
Morrison et al.

(10) Patent No.: US 12,284,760 B2
(45) Date of Patent: Apr. 22, 2025

(54) CIRCUIT BOARD ASSEMBLY WITH INTERPOSER CIRCUIT BOARD AND CORRESPONDING ELECTRONIC DEVICES AND METHODS

(71) Applicant: Motorola Mobility LLC, Chicago, IL (US)

(72) Inventors: Wayne G Morrison, Lake Zurich, IL (US); Puckpol Chutakanonta, Chicago, IL (US)

(73) Assignee: Motorola Mobility LLC, Chicago, IL (US)

( * ) Notice: Subject to any disclaimer, the term of this patent is extended or adjusted under 35 U.S.C. 154(b) by 256 days.

(21) Appl. No.: 17/892,685

(22) Filed: Aug. 22, 2022

(65) Prior Publication Data

US 2024/0064899 A1    Feb. 22, 2024

(51) Int. Cl.
*H05K 1/18* (2006.01)
*H05K 1/14* (2006.01)
*H05K 3/36* (2006.01)

(52) U.S. Cl.
CPC .......... *H05K 1/145* (2013.01); *H05K 1/181* (2013.01); *H05K 3/368* (2013.01); *H05K 2201/041* (2013.01); *H05K 2201/10128* (2013.01); *H05K 2203/167* (2013.01)

(58) Field of Classification Search
CPC ........ H05K 1/145; H05K 1/181; H05K 3/368; H05K 2201/041; H05K 2201/10128; H05K 2203/167
USPC ......................................................... 361/784
See application file for complete search history.

(56) References Cited

U.S. PATENT DOCUMENTS

| 3,786,206 A | 1/1974 | Kurimsky |
| 3,969,595 A | 7/1976 | Johnson |
| 4,035,794 A | 7/1977 | Norton |
| 4,771,139 A | 9/1988 | DeSmet |
| 5,268,819 A | 12/1993 | Lonka |
| 5,504,659 A | 4/1996 | Acatay et al. |
| 5,791,459 A | 8/1998 | Hester |
| 6,079,988 A | 6/2000 | Hashiguchi et al. |
| 6,466,118 B1 | 10/2002 | Van Zeeland |
| 6,680,676 B1 | 1/2004 | Hayashi |
| 7,105,759 B1 | 9/2006 | Mucha |
| 8,314,721 B2 | 11/2012 | Xu |
| 11,304,317 B2 | 4/2022 | Cavallaro et al. |

(Continued)

OTHER PUBLICATIONS

Paghadal, Paresh H., "NonFinal Office Action", U.S. Appl. No. 17/892,697, filed Aug. 22, 2022; Mailed Apr. 23, 2024.

(Continued)

*Primary Examiner* — Binh B Tran
(74) *Attorney, Agent, or Firm* — Philip H. Burrus, IV

(57) ABSTRACT

An electronic device includes a first circuit board, a second circuit board, and an interposer circuit board. The interposer circuit board defines a walled interface mechanically attaching the first circuit board to the second circuit board. One or more electronic circuit components are positioned within the walled interface and are mechanically attached to one of the first circuit board or the second circuit board. An electronic circuit interface component is mechanically attached to the first circuit board outside the walled interface. The electronic circuit interface component is electronically coupled to the one or more electronic circuit components.

20 Claims, 14 Drawing Sheets

(56) References Cited

U.S. PATENT DOCUMENTS

| | | | |
|---|---|---|---|
| 11,317,512 B2* | 4/2022 | Ha | H05K 1/142 |
| 2005/0230841 A1 | 10/2005 | Walk | |
| 2007/0178763 A1* | 8/2007 | Yang | H05K 9/002 |
| | | | 439/607.35 |
| 2009/0033521 A1 | 2/2009 | Ladouceur | |
| 2010/0296258 A1 | 11/2010 | Geswender | |
| 2013/0148322 A1 | 6/2013 | Fosnes | |
| 2014/0301048 A1 | 10/2014 | Linder | |
| 2016/0353573 A1 | 12/2016 | Chen | |
| 2018/0084636 A1 | 3/2018 | Pakula et al. | |
| 2018/0092213 A1 | 3/2018 | Provencher et al. | |
| 2020/0337188 A1 | 10/2020 | Yun et al. | |
| 2021/0072801 A1 | 3/2021 | Leopold | |
| 2021/0144856 A1 | 5/2021 | Park et al. | |
| 2021/0210880 A1 | 7/2021 | Fukakusa | |
| 2022/0104356 A1 | 3/2022 | Min et al. | |
| 2022/0191352 A1 | 6/2022 | Park | |
| 2022/0400572 A1 | 12/2022 | Park | |

OTHER PUBLICATIONS

Paghadal, Paresh H., "Final Office Action", U.S. Appl. No. 17/892,697; Filed Aug. 22, 2022; Mailed Nov. 8, 2024.

* cited by examiner

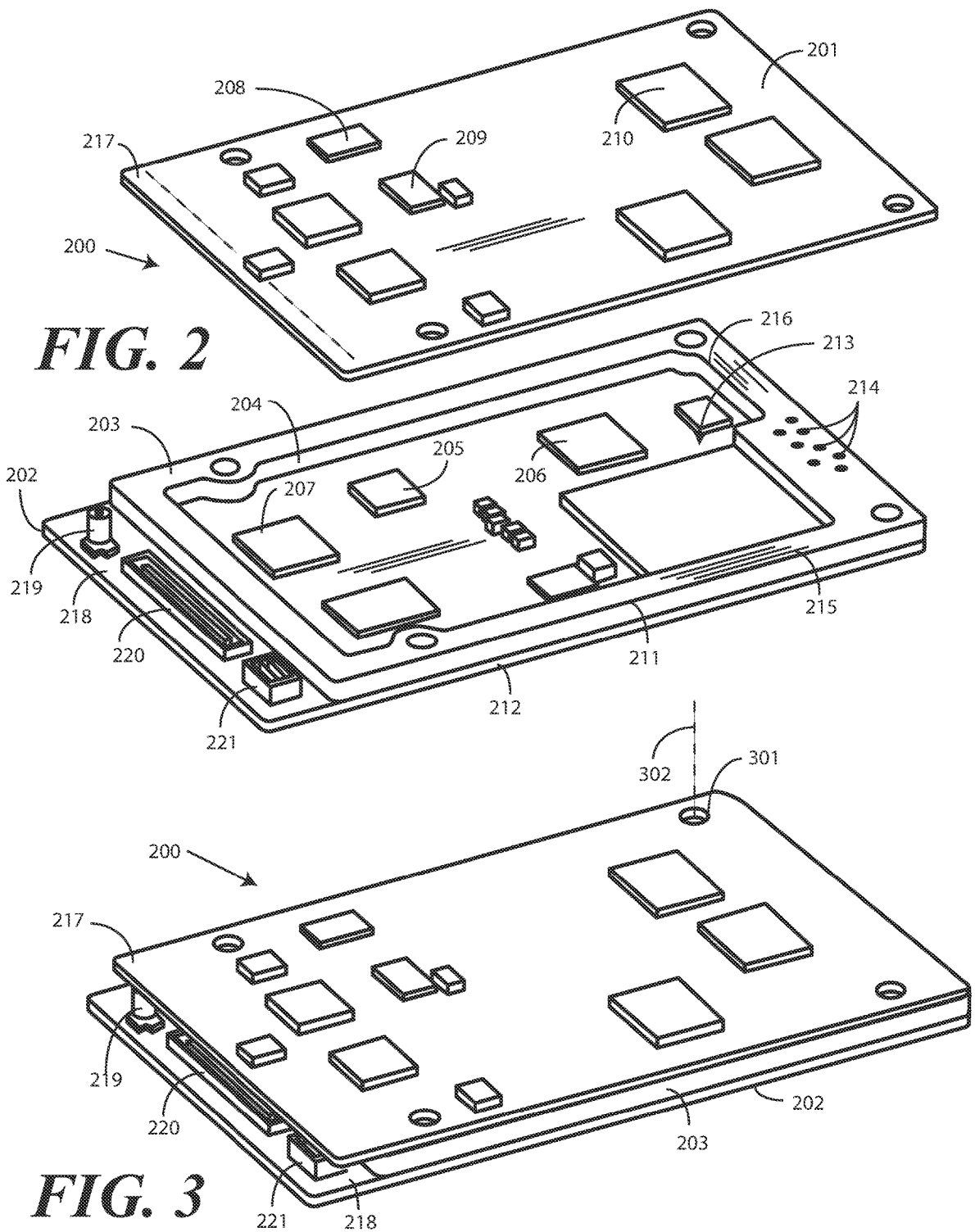

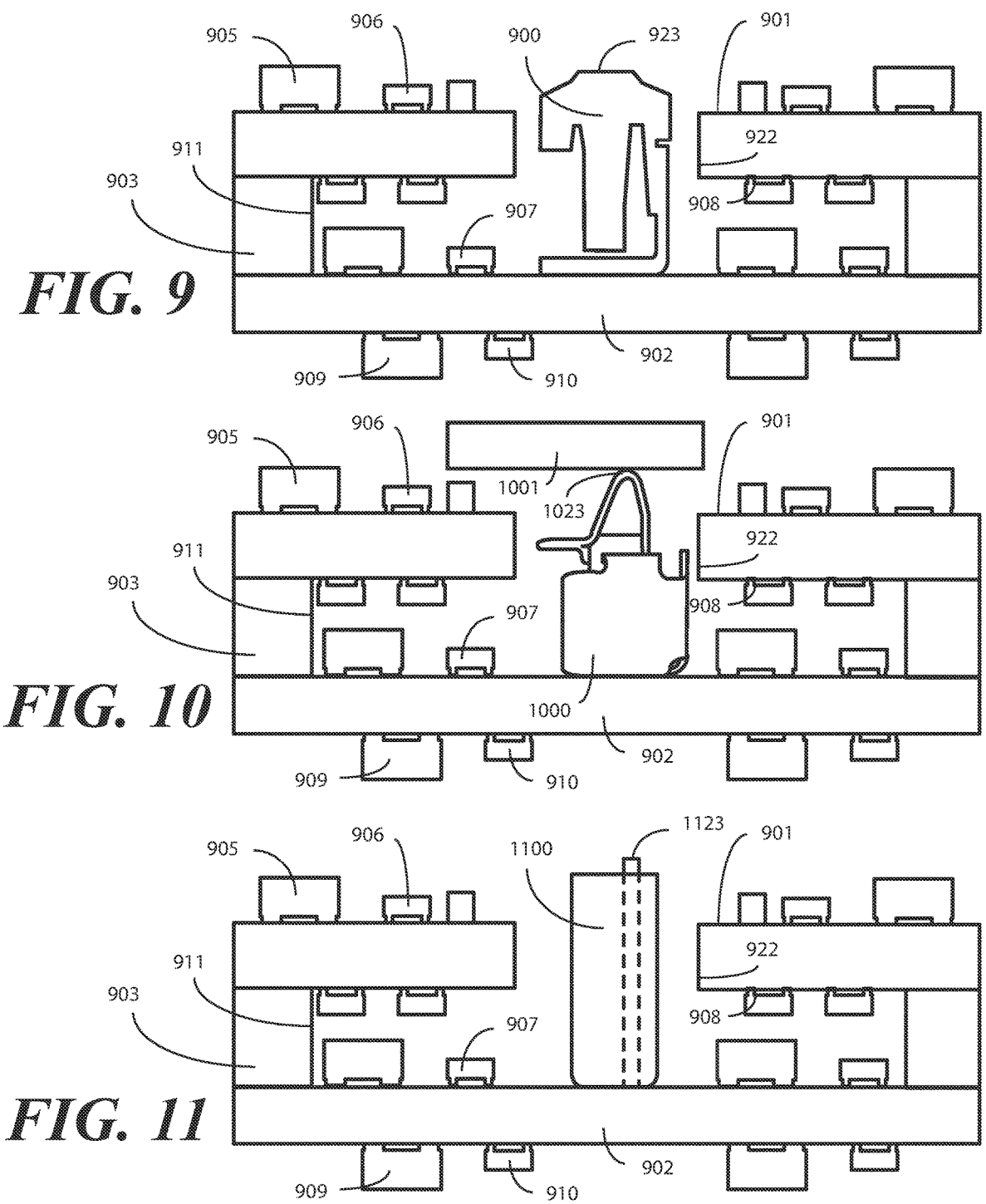

CIRCUIT BOARD ASSEMBLY WITH INTERPOSER CIRCUIT BOARD AND CORRESPONDING ELECTRONIC DEVICES AND METHODS

BACKGROUND

Technical Field

This disclosure relates generally to electronic devices, and more particularly to electronic devices using circuit board assemblies.

Background Art

Portable electronic communication devices, especially smartphones and tablet computers, have become ubiquitous. People all over the world use such devices to stay connected.

As the technology incorporated into these devices has advanced, so too has the feature set they offer. While not too long ago a mobile phone could, at best, make voice calls and send text messages, today's smart devices include geolocators for navigation, health sensors for health monitoring, powerful processors and large memories for gaming and other computation-intensive tasks, powerful wireless radios for wide area and local area communications, long-lasting batteries for extended operation, and biometric sensors for user authentication. All of these components and their associated circuitry takes up a relatively large amount of space within the device. At the same time, consumers still prefer smaller devices capable of easily fitting into a pocket. It would be advantageous to have improved systems and methods to optimize the placement of such components within an electronic device without enlarging the overall form factor.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present disclosure.

FIG. 2 illustrates one explanatory circuit board assembly in accordance with one or more embodiments of the disclosure shown in a partially assembled state.

FIG. 3 illustrates the explanatory circuit board assembly of FIG. 2 in an assembled state.

FIG. 9 illustrates one explanatory electronic circuit interface component and placement configuration in accordance with one or more embodiments of the disclosure.

FIG. 10 illustrates another explanatory electronic circuit interface component and placement configuration in accordance with one or more embodiments of the disclosure.

FIG. 11 illustrates still another explanatory electronic circuit interface component and placement configuration in accordance with one or more embodiments of the disclosure.

Figure 1:
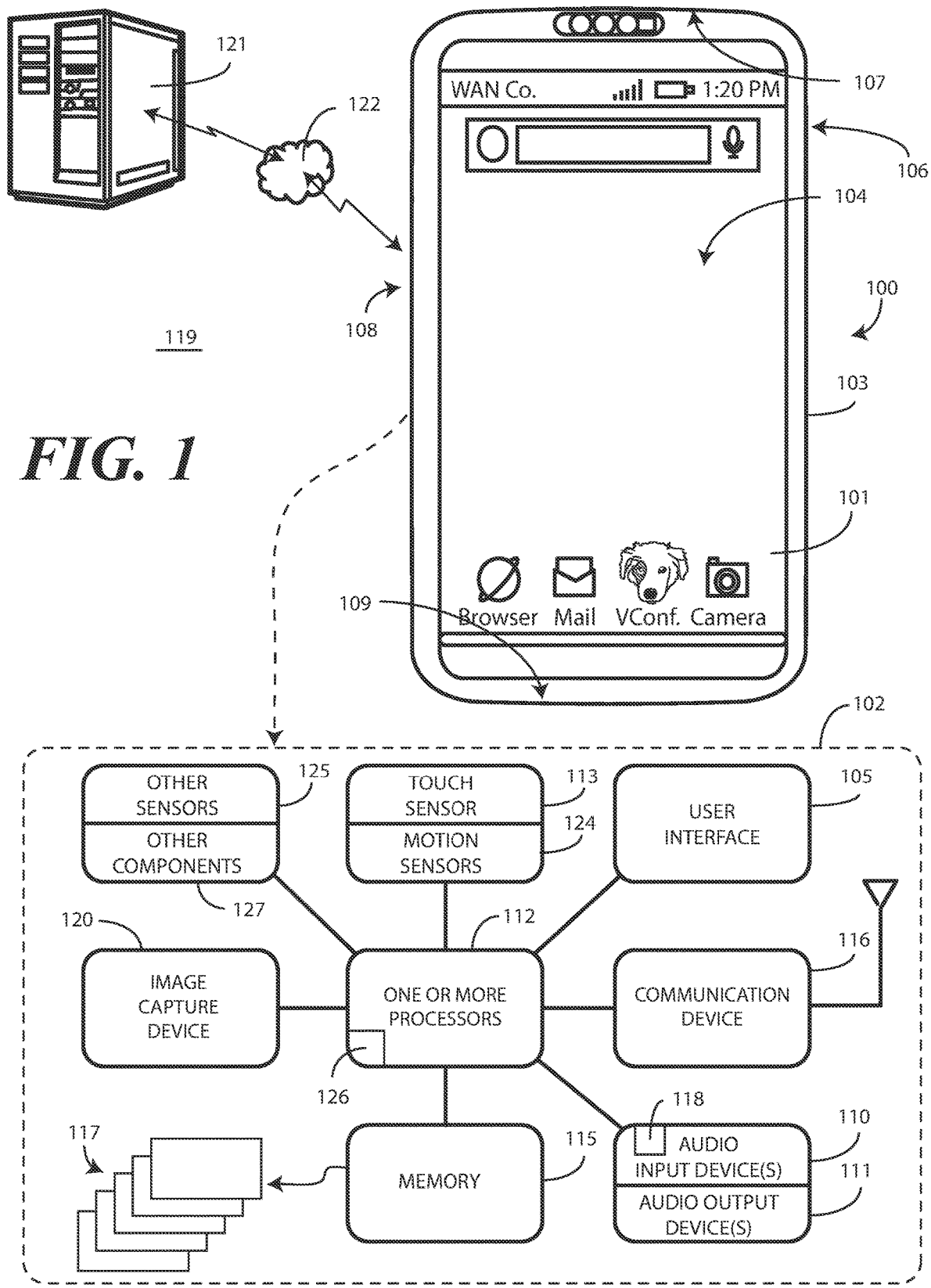
FIG. 1 illustrates one explanatory electronic device in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Before describing in detail embodiments that are in accordance with the present disclosure, it should be observed that the embodiments reside primarily in combinations of method steps and apparatus components related to circuit board assemblies having an interposer circuit board situated between a first circuit board and a second circuit board, with one or more electronic circuit interface components mechanically attached either within a walled interface defined by the interposer circuit board or outside that walled interface. Alternate implementations are included, and it will be clear that method or assembly steps may be executed out of order from that shown or discussed, including substantially concurrently or in reverse order, depending on the functionality involved. Accordingly, the apparatus components and method steps have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions.

As used herein, components may be "operatively coupled" when information can be sent between such components, even though there may be one or more intermediate or intervening components between, or along the connection path. The terms "substantially," "essentially," "approximately," "about," or any other version thereof, are defined as being close to as understood by one of ordinary skill in the art, and in one non-limiting embodiment the term is defined to be within ten percent, in another embodiment within five percent, in another embodiment within one percent and in another embodiment within one-half percent. The term "coupled" as used herein is defined as connected, although not necessarily directly and not necessarily mechanically. Also, reference designators shown herein in parenthesis indicate components shown in a figure other than the one in discussion. For example, talking about a device (10) while discussing figure A would refer to an element, 10, shown in figure other than figure A.

As noted above, modern smart electronic devices offer a multitude of powerful computing features to the people who use them. The provision of these features requires an ever-increasing number of components. Consumers want longer battery life, but this requires a larger battery. Consumers want to take better pictures, but this requires more image capture devices. Consumers want to be able to take "selfies," which requires even more image capture devices. Navigation requires location detectors capable of communicating with terrestrial and satellite networks. Health monitoring and authorized user authentication requires a plurality of biometric sensors. The list goes on, while the space within an electronic device tends to stay the same.

Advantageously, embodiments of the disclosure help designers to more compactly "pack" all of these components into an electronic device without requiring that the device get larger. To do this, embodiments of the disclosure use stacked circuit board assemblies where a first circuit board having electronic components attached thereto is stacked atop another circuit board having electronic components attached thereto. This stacking is advantageous when optimizing the area within an electronic device. Moreover, this new electronic packaging architecture offers new ways to integrate components.

In one or more embodiments, an interposer circuit board is positioned between a first circuit board and a second circuit board. The interposer circuit board, like the first circuit board and the second circuit board, can be configured from layers of a circuit board substrate, such as fiberglass or FR4. In one embodiment, the interposer circuit board is manufactured from multiple layers. Some layers can be selectively placed conductive metal, such as copper or aluminum, while other layers can be insulative. Insulative layers can be manufactured from fiberglass, FR4, or other materials. The conductive layers can be used to run traces and position vias that electrically couple the first circuit board to the second circuit board.

In one or more embodiments, the interposer circuit board defines a walled interface mechanically attaching the first circuit board to the second circuit board. One or more electronic circuit components can then be positioned within the walled interface, outside the walled interface, or in combinations thereof. Thereafter, an electronic circuit interface component can be mechanically attached to one of the first circuit board or the first circuit board and electrically coupled to the one or more electronic circuit components.

Like the electronic circuit components, the electronic circuit interface component can be situated within the walled interface or outside of it. When situated outside the walled interface, the electronic circuit components are mechanically attached to either the first circuit board or the second circuit board and electrically coupled to the one or more electronic circuit components by conductive traces that run over, beneath, or through the interposer circuit board. In one or more embodiments, the electronic circuit interface component attaches to the first circuit board or second circuit board such that it can be accessed from an edge of the first circuit board or the second circuit board.

In other embodiments, the electronic circuit interface component can be mechanically attached to the first circuit board or second circuit board inside the walled interface. Thereafter, the electronic circuit interface component can be electrically coupled to the one or more electronic circuit components attached to the first circuit board or second circuit board. Since the electronic circuit interface component is situated within the walled interface of the interposer circuit board, which is bounded by the first circuit board and second circuit board, in one or more embodiments either the first circuit board or the second circuit board defines an interface component aperture. In one or more embodiments, at least a portion of the electronic circuit interface component extends from the circuit board to which it is attached through the interface component aperture of the other circuit board.

This stacked board configuration is capable of densely packing the electronic circuit components due to the ability of surface mounted electronic circuit components to be closely populated. Meanwhile, the interposer circuit board creates a "cavity" defined by the walled interface. Where the interposer circuit board passes along the perimeter of the first circuit board and second circuit board attached thereto, electronic circuit components can be positioned within the walled interface. When the perimeter of the interposer circuit board passes along only a portion of the first circuit board and/or second circuit board, electronic circuit components can be positioned both within the walled interface and outside the walled interface. Since the interposer circuit board sits between the first circuit board and the second circuit board, electronic circuit components can be attached to the top and bottom of each of the first circuit board and second circuit board to even more densely pack the components.

Embodiments of the disclosure offer other advantages in that they can accommodate electronic circuit interface components such as switches, electrical connectors, and spring contacts. In one or more embodiments, the electronic circuit interface component is coupled to the edge of a circuit board outside the walled interface of the interposer circuit board. The interposer circuit board can include a recess in which the electronic circuit interface component situates. One or both of the first circuit board or the second circuit board can extend above and/or below the electronic circuit interface component. This allows access to the electronic circuit interface component without disrupting the ability to densely pack the electronic circuit components.

In embodiments where the electronic circuit interface component situates within the walled interface defined by the interposer circuit board, one of the first circuit board or the second circuit board will include an interface component aperture that allows access to the electronic circuit interface component. Illustrating by example, a switch can be coupled to a first circuit board with a portion of the switch extending through the interface component aperture so that the portion of the switch is exposed and accessible through the interface component aperture. Spring contacts and connectors can be mounted in similar fashion. Corresponding methods and devices are also disclosed below. While additional advantages offered by embodiments of the disclosure will be illustrated below, still others will be obvious to those of ordinary skill in the art having the benefit of this disclosure.

Turning now to FIG. 1, illustrated therein is one explanatory electronic device 100 configured in accordance with one or more embodiments of the disclosure. It should be noted that the electronic device 100 can be one of various types of devices. In one embodiment, the electronic device 100 is a portable electronic device, one example of which is a smartphone that will be used in the figures for illustrative purposes. However, it should be obvious to those of ordinary skill in the art having the benefit of this disclosure that the electronic device 100 could be other types of devices as well, including palm-top computers, tablet computers, gaming devices, media players, wearable devices, or other portable wireless communication devices. Still other devices will be obvious to those of ordinary skill in the art having the benefit of this disclosure.

Also illustrated in FIG. 1 is one explanatory block diagram schematic 102 of the explanatory electronic device 100 of FIG. 1. It should be understood that FIG. 1 is provided for illustrative purposes only and for illustrating components of one electronic device 100 in accordance with embodiments of the disclosure and is not intended to be a complete block diagram schematic 102 of the various components that can be included with the electronic device 100. Therefore, other electronic devices in accordance with embodiments of the disclosure may include various other components not shown in FIG. 1 or may include a combination of two or more components or a division of a particular component into two or more separate components, and still be within the scope of the present disclosure.

In one or more embodiments, the block diagram schematic 102 is configured as a printed circuit board assembly disposed within a device housing 103 of the electronic device 100. Examples of various printed circuit board assemblies will be described in more detail with reference to FIGS. 2-3, 7-8, and 12-19 below. In one or more embodiments, the printed circuit board assembly is configured with a first circuit board, a second circuit board, and an interposer circuit board mechanically attaching and electrically coupling the first circuit board to the second circuit board. In one or more embodiments, the interposer circuit board defines a walled interface. One or more electronic circuit components can be positioned within the walled interface and attached to the first circuit board, the second circuit board, or combinations thereof. An electronic circuit interface component can be mechanically attached to one of the first circuit board or the second circuit board outside the walled interface in one or more embodiments. In other embodiments, the electronic circuit interface component is mechanically attached to one of the first circuit board or the second circuit board within the walled interface such that at least a portion of the electronic circuit interface component extends from that circuit board through an interface component aperture of the other circuit board. Various components can be electrically coupled together by conductors, or a bus disposed along the first circuit board, the second circuit board, the interposer circuit board, or combinations thereof.

The illustrative block diagram schematic 102 of FIG. 1 includes many different components. Embodiments of the disclosure contemplate that the number and arrangement of such components can change depending on the particular application. Accordingly, electronic devices configured in accordance with embodiments of the disclosure can include some components that are not shown in FIG. 1, and other components that are shown may not be needed and can therefore be omitted.

In one or more embodiments, the device housing 103 of the electronic device 100 defines a first major surface 104 and a second major surface (the rear surface that is opposite major surface 104). In one or more embodiments, the first major surface 104 and the second major surface are separated by one or more minor surfaces 106,107,108,109 as well. In one or more embodiments, a user interface 105 of the electronic device 100 includes a first display 101 positioned on the first major surface 104 of the electronic device 100. In one or more embodiments, the user interface 105 optionally includes a second display positioned on the second major surface of the electronic device 100. In some embodiments, the electronic device 100 may also include one or more displays on the one or more minor surfaces 106,107,108,109 as well.

In still other embodiments, the electronic device 100 will include a single display that wraps about the device housing 103 of the electronic device 100. For example, the single display may have a first portion that serves as the first display 101, a second portion that wraps around minor surface 106, and a third portion that serves as the second display. Thus, while an electronic device 100 with one display is illustrated in FIG. 1, in other embodiments the electronic device can include multiple displays or a single display that wraps about multiple faces of the electronic device 100.

In one or more embodiments, both the first display 101 and (where included) the second display comprise touch sensitive displays. Where so configured, information, graphical objects, user actuation targets, and other graphical indicia can be presented using these display(s). In one or more embodiments, so as to be touch sensitive, each display 101 comprises a corresponding touch sensor 113.

In one or more embodiments, the touch sensor 113 can comprise any of a capacitive touch sensor, an infrared touch sensor, resistive touch sensors, inductive touch sensing, another touch-sensitive technology, or combinations thereof. Capacitive touch-sensitive devices include a plurality of capacitive sensors, e.g., electrodes, which are disposed along a substrate. Where so configured, each capacitive sensor can be configured, in conjunction with associated control circuitry, e.g., the one or more processors 112, to detect an object in close proximity with—or touching—the surface of the display(s) by establishing electric field lines between pairs of capacitive sensors and then detecting perturbations of those field lines.

The electric field lines can be established in accordance with a periodic waveform, such as a square wave, sine wave, triangle wave, or other periodic waveform that is emitted by one sensor and detected by another. The capacitive sensors can be formed, for example, by disposing indium tin oxide patterned as electrodes on the substrate. Indium tin oxide is useful for such systems because it is transparent and conductive. Other technologies include metal mesh, silver nano wire, graphene, and carbon nanotubes. Further, it is capable of being deposited in thin layers by way of a printing process. The capacitive sensors may also be deposited on the substrate by electron beam evaporation, physical vapor deposition, or other various sputter deposition techniques.

In one or more embodiments, users can deliver user input to the first display 101 and/or other displays by delivering touch input from a finger, stylus, or other objects disposed proximately with the first display 101 and/or the other displays. In one embodiment, the first display 101 and/or the other displays are configured as an active-matrix organic light emitting diode (AMOLED) display. However, it should be noted that other types of displays, including liquid crystal displays, are suitable for use with the user interface and would be obvious to those of ordinary skill in the art having the benefit of this disclosure.

Other features can be situated on either the first major surface 104 or the second major surface in addition to the first display 101 and/or any other displays. For instance, a user interface component such as a button or other control device can also be disposed on either the first major surface 104 or the second major surface to facilitate additional control of the electronic device 100. Other features can be added and can be located on the front of the device housing 103, sides of the device housing 103, or the rear of the device housing 103. Illustrating by example, in one or more embodiments an imager or a loudspeaker can be positioned on either the first major surface 104 or the second major surface.

While the electronic device 100 is illustrated as being a hand-held device in FIG. 1, it could also be configured as a wearable device. Illustrating by example, electronic devices configured in accordance with embodiments of the disclosure can include a housing and one or more straps that allow the electronic device to be worn around a wrist as a watch or folded over and clipped to a garment. Other types of wearable electronic devices and/or other mechanical configurations of wearable electronic devices will be obvious to those of ordinary skill in the art having the benefit of this disclosure.

In one or more embodiments, the electronic device 100 includes one or more processors 112. In one embodiment, the one or more processors 112 can include an application processor and, optionally, one or more auxiliary processors. One or both of the application processor or the auxiliary processor(s) can include one or more processors. One or both of the application processor or the auxiliary processor(s) can be a microprocessor, a group of processing components, one or more ASICs, programmable logic, or other type of processing device.

The application processor and the auxiliary processor(s) can be operable with the various components of the block diagram schematic 102. Each of the application processor and the auxiliary processor(s) can be configured to process and execute executable software code to perform the various functions of the electronic device 100 with which the block diagram schematic 102 operates. A storage device, such as memory 115, can optionally store the executable software code used by the one or more processors 112 during operation.

In this illustrative embodiment, the block diagram schematic 102 also includes a communication circuit 116 that can be configured for wired or wireless communication with one or more other devices or networks. The networks can include a wide area network, a local area network, and/or personal area network. The communication circuit 116 may also utilize wireless technology for communication, such as, but are not limited to, peer-to-peer or ad hoc communications such as HomeRF, Bluetooth and IEEE 802.11 and other forms of wireless communication such as infrared technology. The communication circuit 116 can include wireless communication circuitry, one of a receiver, a transmitter, or transceiver, and one or more antennas.

In one or more embodiments, the communication circuit 116 can communicate with one or more embodiments remote servers 121 across a network 122. Illustrating by example, to engage in videoconferences the communication circuit 116 may begin communication with a video conferencing system server complex across the network 122. The video conferencing system server complex may then include components such as a web server, a database server, an audio server, and optionally a video server (the video server may be omitted for audio only conferencing systems) that are operable to facilitate videoconferences between the various electronic devices of the videoconference system.

In one or more embodiments, the one or more processors 112 can be responsible for performing the primary functions of the electronic device with which the block diagram schematic 102 is operational. For example, in one embodiment the one or more processors 112 comprise one or more circuits operable with the user interface 105 to present presentation information to a user. Additionally, the one or more processors 112 can be operable with the audio output 111 to deliver audio output to a user. The executable software code used by the one or more processors 112 can be configured as one or more modules 117 that are operable with the one or more processors 112. Such modules 117 can store instructions, control algorithms, and so forth.

In one or more embodiments, the block diagram schematic 102 includes an audio processor 118. In one or more embodiments, the audio processor 118 is operable to receive audio input from a source, such as a person or persons, who are situated within an environment 119 about the electronic device 100. The audio processor 118 can also receive audio input from the environment 119 as well. The audio processor 118 can include hardware, executable code, and speech monitor executable code in one embodiment.

In one embodiment, the audio processor 118 is configured to implement a voice control feature that allows the electronic device 100 to function as a voice assistant device, which is a digital assistant using voice recognition, speech synthesis, and natural language processing to receive audio input comprising a voice command from a source, determine the appropriate response to the voice command, and then deliver the response in the form of audio output in response to receiving the audio input from the source. When so configured, a user can speak commands to cause the one or more processors 112 of the electronic device 100 to execute a control operation. In one or more embodiments the audio processor 118 listens for voice commands, processes the commands and, in conjunction with the one or more processors 112, performs one or more control operations, such as delivering audio output, in response to receiving audio input.

Various sensors 125 can be operable with the one or more processors 112. An image capture device 120 can be included in the electronic device 100 and can be operable with the one or more processors 112. The image capture device 120 can include one or more sensors, which can include a front-facing camera or imager, a rear-facing camera or imager, or another imager. In one or more embodiments the image capture device 120 comprise at least one or more of an imager, a depth imager, and one or more proximity sensors.

Other sensors 125 can be operable with the one or more processors 112 as well. Illustrating by example, in one or more embodiments the other sensors include a skin sensor is configured to determine when the electronic device 100 is touching the skin of a person. For example, in one or more embodiments the skin sensor can determine when the electronic device 100 is being held within the hand of a user. In one embodiment, the skin sensor can include a substrate with an electrode disposed thereon. The electrode can confirm the object touching the skin sensor is skin by detecting electrical signals generated by a heartbeat in one embodiment. Other forms of skin sensors will be obvious to those of ordinary skill in the art having the benefit of this disclosure.

The other sensors 125 can include a light sensor. The light sensor can be used to detect whether or not direct light is incident on the device housing 103 of the electronic device 100 in one or more embodiments. The light sensor can also be used to detect an intensity of ambient light is above or below a predefined threshold in one or more embodiments.

In one or more embodiments the light sensor can detect changes in optical intensity, color, light, or shadow in the near vicinity of the electronic device 100. This can be used to make inferences about whether the electronic device 100 is in a stowed state. If, for example, the light sensor detects low-light conditions, i.e., when the intensity of received ambient light is below a predefined threshold, this can indicate that the electronic device 100 is disposed within a pocket, drawer, or purse. In one embodiment, the light sensor can be configured as an image-sensing device that captures successive images about the device and compares luminous intensity, color, or other spatial variations between images to detect weather conditions.

The other sensors 125 can include a temperature sensor configured to monitor the temperature of the environment. The temperature sensor can take various forms. In one embodiment, the temperature sensor is simply a proximity sensor component. In another embodiment, the temperature sensor comprises a simple thermopile. In another embodiment, the temperature sensor comprises an infrared imager that captures the amount of thermal energy emitted by an object. Other types of temperature sensors will be obvious to those of ordinary skill in the art having the benefit of this disclosure.

The other sensors 125 can include a force sensor. The force sensor can take various forms. For example, in one embodiment, the force sensor comprises resistive switches or a force switch array configured to detect contact with one or both of the display 101 or the device housing 103 of the electronic device 100. In another embodiment, the force sensor can be capacitive. In yet another embodiment, piezoelectric sensors can be configured to sense force as well. Other types of force sensors will be obvious to those of ordinary skill in the art having the benefit of this disclosure.

The other sensors 125 can also include an audio input 110 comprising one or more microphones operable to receive acoustic input. While the one or more microphones can be used to sense voice input, voice commands, and other audio input, in one or more embodiments they can also be used as environmental sensors to sense environmental sounds such as rumpling of soft surfaces of textile materials or other similar materials encapsulating the electronic device 100 when the electronic device 100 is in a stowed state. Alternatively, the one or more microphones can be used to detect the nearby presence of items when the electronic device 100 is in a stowed state, such as coins, medications, grooming items, notecards, keys, lotions, notepads, lip balm, and other items that may be near the electronic device 100 when stowed in a container such as a purse.

The other sensors 125 can also include a moisture sensor. The moisture sensor can be configured to detect the amount of moisture on or about the display 101 or the device housing 103 of the electronic device 100. The moisture sensor can be realized in the form of an impedance sensor that measures impedance between electrodes. Other types of moisture sensors will be obvious to those of ordinary skill in the art having the benefit of this disclosure.

The other sensors 125 can include a distance measurement sensor. The distance measurement sensor can take various forms. In one or more embodiments, the distance measurement sensor comprises a time-of-flight depth imager, which can also be one form of depth imager mentioned above. In another embodiment, the distance measurement sensor can comprise a radar device. In still another embodiment, the distance measurement sensor can comprise a sonar device. In yet another embodiment, the distance measurement sensor can comprise an ultrasound distance measurement device.

Regardless of type, in one or more embodiments the distance measurement sensor can perform distance determination operations. For example, the distance measurement sensor can measure distances between objects situated within the environment 119 of the electronic device 100 in one or more embodiments. In other embodiments, the distance measurement sensor can determine changes in distances between the electronic device 100 and objects situated within the environment 119. Combinations of these operations can be performed as well.

The electronic device 100 can include one or more motion sensors 124. The one or more motion sensors 124 can function as an orientation detector configured to determine a spatial orientation of the electronic device 100 in three-dimensional space. The one or more motion sensors 124 can include one or more accelerometers or gyroscopes. For example, an accelerometer may be embedded in the electronic circuitry of the electronic device 100 to show vertical orientation, constant tilt and/or whether the electronic device 100 is stationary. The measurement of tilt relative to gravity is referred to as "static acceleration," while the measurement of motion and/or vibration is referred to as "dynamic acceleration." A gyroscope can be used in a similar fashion.

In one or more embodiments, the one or more motion sensors 124 can detect motion of the electronic device (100). The one or more motion sensors 124 can be used to sense some of the gestures of a user as well. The one or more motion sensors 124 can be used to determine the spatial orientation of the electronic device (100) as well in three-dimensional space by detecting a gravitational direction. The one or more motion sensors 124 can also include an electronic compass to detect the spatial orientation of the electronic device (100) relative to the earth's magnetic field.

A context engine 126 can be operable with the other sensors 125 to detect, infer, capture, and otherwise determine persons and actions that are occurring in an environment 119 about the electronic device 100. For example, where included one embodiment of the context engine 126 determines assessed contexts and frameworks using adjustable algorithms of context assessment employing information, data, and events. These assessments may be learned through repetitive data analysis. Alternatively, a user may employ the user interface 105 to enter various parameters, constructs, rules, and/or paradigms that instruct or otherwise guide the context engine 126 in detecting stowed states of the electronic device 100, held states of the electronic device 100, multi-modal social cues, emotional states, moods, and other contextual information. The context engine 126 can comprise an artificial neural network or other similar technology in one or more embodiments.

In one or more embodiments, the context engine 126 is operable with the one or more processors 112. In some embodiments, the one or more processors 112 can control the context engine 126. In other embodiments, the context engine 126 can operate independently, delivering information gleaned from detecting stowed states of the electronic device 100, held states of the electronic device 100, multimodal social cues, emotional states, moods, and other contextual information to the one or more processors 112. The context engine 126 can receive data from the other sensors 125. In one or more embodiments, the one or more processors 112 are configured to perform the operations of the context engine 126.

Other components 127 operable with the one or more processors 112 can include output components such as video, audio, and/or mechanical outputs. For example, the output components may include a video output component or auxiliary devices including a cathode ray tube, liquid crystal display, plasma display, incandescent light, fluorescent light, front or rear projection display, and light emitting diode indicator. Other examples of output components include audio output components such as the one or more loudspeakers or other alarms and/or buzzers. The other components 127 can also include a mechanical output component such as vibrating or motion-based mechanisms.

As can be surmised at this point, the electronic device 100 can include a lot of stuff depending upon how many of the components described above are included. This "stuff" takes a lot of space in prior art designs. However, embodiments of the disclosure contemplate that consumers still desire small electronic devices—especially when the electronic device 100 is a smartphone—so that the user interface 105 can easily be manipulated with one hand and/or so the electronic device 100 can easily fit within a pocket.

The problem thus becomes where to pack all of this "stuff." Embodiments of the disclosure provide a solution to this dilemma by using a stacked circuit board assembly that utilizes an interposer circuit board. While the interposer circuit board defines a walled interface within which electronic circuit components can be positioned, embodiments of the disclosure advantageously allow access to electronic circuit interface components such as switches, spring contacts, and connectors. This access is provided regardless of whether the electronic circuit interface component is positioned within the walled interface of the interposer circuit board or outside the interposer circuit board. Examples of how this occurs are described in FIGS. 2-3, 7-8, and 12-19. Any of these examples can be used in conjunction with the electronic device 100 of FIG. 1, with the corresponding circuit board assembly being positioned within the device housing 103 of the electronic device 100 to support the components described with reference to the schematic block diagram 102 to provide device functionality.

Beginning with FIG. 2, illustrated therein is a first explanatory circuit board assembly 200 configured in accordance with one or more embodiments of the disclosure. The circuit board assembly 200 of FIG. 2 is shown in a partially assembled configuration. The circuit board assembly 200 will be shown in an assembled configuration in FIG. 3.

In one or more embodiments, the circuit board assembly 200 includes a first circuit board 201, a second circuit board 202, and an interposer circuit board 203. In one or more embodiments, the interposer circuit board 203 defines a walled interface 204 and mechanically attaches and electrically couples the first circuit board 201 to the second circuit board 202. One or more electronic circuit components 205,206,207 can be positioned within the walled interface 204 and mechanically attached and electrically coupled to the first circuit board 201, the second circuit board 202, or combinations thereof. Illustrating by example, one or more electronic circuit components similar to those shown coupled to the top of the first circuit board 201 can be coupled to the bottom of the first circuit board 201 within the walled interface 204. As shown in FIG. 1, one or more embodiments electronic circuit components 205,206,207 can also be coupled to the second circuit board 202 within the walled interface 204 as well. In one or more embodiments, each of the first circuit board 201 and the second circuit board 202 have one or more electronic circuit components 205,206,207 arranged on their upper and lower major surfaces.

Each of the first circuit board 201, the second circuit board 202, and the interposer circuit board 203 can comprise a printed wiring board substrate. According to various embodiments, the first circuit board 401 or the second circuit board 402 may be configured as a printed wiring boards manufactured from layers of a material such as fiberglass or FR4, with one or more conductive layers positioned therebetween. In one or more embodiments, each of the first circuit board 201, second circuit board 202, and interposer circuit board 203 is rigid, but in other embodiments can be manufactured as a flexible circuit board. Illustrating by example, one or more of the first circuit board 201, the second circuit board 202, and/or the interposer circuit board 203 can include a combination of rigid and flexible components. The flexible components may be manufactured from a flexible substrate and one or more flexible conductive layers. For example, one or more conductive layers may be positioned between areas of a polyimide film.

In addition to providing an electrical and mechanical connection between the first circuit board 201 and the second circuit board 202, the interposer circuit board 203 can also provide a shield for the one or more electronic circuit components 205,206,207 positioned within the walled interface 204. As will be described below, in other embodiments one or more electrical shields can be positioned atop electronic circuit components as well. The first circuit board 201 and/or second circuit board 202 can include layers of conductive material that provide electromagnetic shielding effects as well.

In the illustrative embodiment of FIG. 2, the interposer circuit board 203 is positioned between the first circuit board 201 and the second circuit board 202 and electrically couples the electronic circuit components 208,209,210 attached to the first circuit board 201 to the electronic circuit components 205,206,207 attached to the second circuit board 202. While the interposer circuit board 203 is positioned between the first circuit board 201 and the second circuit board 202, the walled interface 204 defines a cavity within the interposer circuit board 203 where electronic circuit components 205,206,207 can be positioned. In one or more embodiments, the interposer circuit board 203 comprises a copper clad laminate structure including a plurality of pre-impregnated material layers such as insulating fiberglass or resin layers with conductive layers disposed therebetween.

In the illustrative embodiment of FIG. 2, the interposer circuit board 203 passes along the outer perimeter of three sides of the first circuit board 201 and the second circuit board 202. Said differently, the interposer circuit board 203 has an exterior perimeter 211 that is equal to the exterior perimeter 212 of the first circuit board 201 and the second circuit board 202 on three sides. The interposer circuit board 203 of this illustrative embodiment is configured as a closed loop so as to define an aperture 213 that is bounded by the interior surface of the walled interface 204, which defines an aperture perimeter 216 of the interposer circuit board 203. In one or more embodiments, the interposer circuit board 203 defines one or more vias 214 and/or electrical traces 215 that electrically couple the first circuit board 201 to the second circuit board 202 between the exterior perimeter 211 and the aperture perimeter 216.

For example, the interposer circuit board 203 may comprise an insulating substrate that surrounds a plurality of conductive elements, examples of which include electrical traces 215, which a plurality of vias 214 providing electrical connections between electrical contacts situated on the bottom of the first circuit board 201 and other electrical contacts situated on the top of the second circuit board 202. In one or more embodiments, the interposer circuit board 203 includes a first surface facing toward the first circuit board 201 and a second surface facing toward the second circuit board 202.

The vias 214 electrically connect electrical contacts abutting the first surface and the second surface of the interposer circuit board 203. When these electrical contacts are electrically coupled to the electronic circuit components 208, 209,210 coupled to the first circuit board 201 and the electronic circuit components 205,206,207 coupled to the second circuit board 202, the vias 214 can couple those electronic circuit components 205,206,207,208,209,210 together through the interposer circuit board 203. In other embodiments, additional electrical contacts (not shown) can electrically couple the first circuit board 201 and second circuit board 202 together. By way of example, a flexible circuit board or board-to-board connector may couple the first circuit board 201 and the second circuit board 202 together directly.

In the illustrative embodiment of FIG. 2, some portions of both the first circuit board 201 and the second circuit board 202 terminate at the exterior perimeter 211 of the interposer circuit board 203 while other portions of both the first circuit board 201 and the second circuit board 202 extend beyond the exterior perimeter 211 of the interposer circuit board 203. For example, in FIG. 2 the outwardly facing edge of both the first circuit board 201 and the second circuit board 202, the rightwardly facing edge of both the first circuit board 201 and the second circuit board 202, and the rearwardly facing edge of both the first circuit board 201 and the second circuit board 202 terminate at the exterior perimeter of the interposer circuit board 203.

By contrast, the leftwardly facing edge of both the first circuit board 201 and the second circuit board 202 extend distally beyond the exterior perimeter 211. This occurs because the first circuit board 201 defines a first circuit board extension 217 extending distally beyond the exterior perimeter 211 of the interposer circuit board 203. Similarly, the second circuit board 202 defines a second circuit board extension 218 that extends distally beyond the exterior perimeter 211 of the interposer circuit board 203. Embodiments of the disclosure advantageously take advantage of this space by mechanically attaching one or more electronic circuit interface components 219,220,221 to the first circuit board extension 217 or the second circuit board extension 218. In this illustrative embodiment, electronic circuit interface component 219 comprises a switch, while electronic circuit interface component 220 comprises a connector. Electronic circuit interface component 221 is a spring contact.

Figure 4:
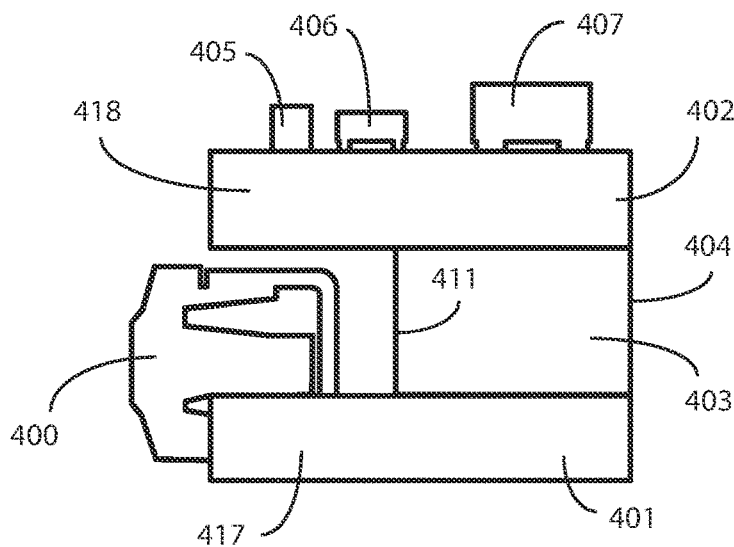
FIG. 4 illustrates one explanatory electronic circuit interface component and placement configuration in accordance with one or more embodiments of the disclosure.
Figure 5:
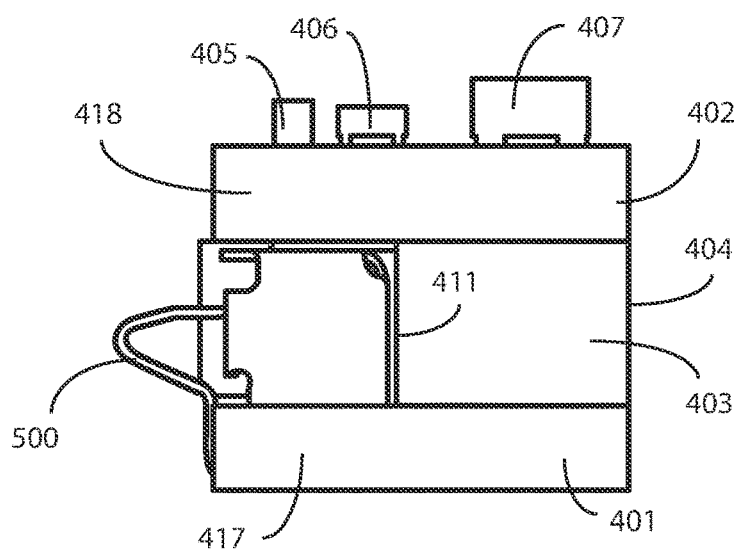
FIG. 5 illustrates another explanatory electronic circuit interface component and placement configuration in accordance with one or more embodiments of the disclosure.
Figure 6:
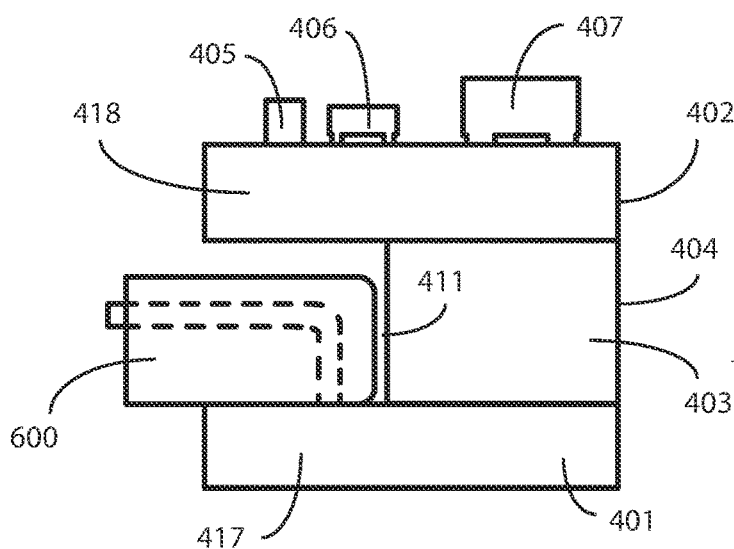
FIG. 6 illustrates still another explanatory electronic circuit interface component and placement configuration in accordance with one or more embodiments of the disclosure.

Embodiments of the disclosure contemplate that the electronic circuit interface components 219,220,221 can take various forms. Turning briefly to FIGS. 4-6, illustrated therein are several examples. These examples are illustrative only, as numerous other electronic circuit interface components will be obvious to those of ordinary skill in the art having the benefit of this disclosure.

Beginning with FIG. 4, in this sectional view a switch 400 is attached to a first circuit board extension 417 of a first circuit board 401. The first circuit board extension 417 extends distally beyond an exterior perimeter 411 of an interposer circuit board 403. The switch 400 is attached to the first circuit board extension 417 outside the walled interface 404 defined by the interposer circuit board 403. In this illustrative embodiment, the switch 400 extends distally beyond the terminal edge of the first circuit board 401. Using the electrical connections described above, the switch 400 is electrically coupled to one or more embodiments electronic circuit components 405,406,407, which can be coupled to the first circuit board 401, the second circuit board 402, or combinations thereof.

In this illustrative embodiment, a second circuit board extension 418 also extends distally beyond the exterior perimeter 411 of the interposer circuit board 403. This results in the switch 400 being positioned between the first circuit board extension 417 and the second circuit board extension 418 in this illustrative embodiment. In this illustrative embodiment, the first circuit board extension 417 and the second circuit board extension 418 each extend the same distance from the exterior perimeter 411 of the interposer circuit board 403. As will be shown below with reference to FIG. 3, in other embodiments the first circuit board extension and second circuit board extension extend different distances from the exterior perimeter of the interposer circuit board. One of the first circuit board extension or the second circuit board extension can be omitted in still other embodiments.

Turning now to FIG. 5, in this sectional view a spring contact 500 is attached to a first circuit board extension 417 of a first circuit board 401. The first circuit board extension 417 extends distally beyond an exterior perimeter 411 of an interposer circuit board 403. The spring contact 500 is attached to the first circuit board extension 417 outside the walled interface 404 defined by the interposer circuit board 403. In this illustrative embodiment, the contact of the spring contact 500 extends distally beyond the terminal edge of the first circuit board 401, thereby allowing it to be actuated by pushing the contact toward the interposer circuit board 403. Using the previously described electrical connections, the spring contact 500 can be electrically coupled to one or more embodiments electronic circuit components 405,406,407.

Turning now to FIG. 6, in this sectional view an electrical connector 600 is attached to a first circuit board extension 417 of a first circuit board 401. The first circuit board extension 417 extends distally beyond an exterior perimeter 411 of an interposer circuit board 403. The electrical connector 600 is attached to the first circuit board extension 417 outside the walled interface 404 defined by the interposer circuit board 403 and extends distally beyond the terminal edge of the first circuit board 401. Using the previously described electrical connections, the electrical connector 600 can be electrically coupled to one or more embodiments electronic circuit components 405,406,407.

Turning now to FIG. 3, illustrated therein is the circuit board assembly 200 of FIG. 2 with the interposer circuit board 203 mechanically attaching the first circuit board 201 to the second circuit board 202. In contrast to FIGS. 4-6, in this illustrative embodiment the second circuit board extension 218 extends distally farther from the exterior perimeter of the interposer circuit board 203 than does the first circuit board extension 217. As noted above, in other embodiments one of the first circuit board extension 217 or the second circuit board extension 218 will be omitted with that circuit board's terminal edge terminating at the exterior perimeter of the interposer circuit board 203. As with FIGS. 4-6, in this illustrative embodiment the electronic circuit interface components 219,220,221 are situated between the first circuit board extension 217 and the second circuit board extension 218.

In one or more embodiments, the first circuit board 201 defines at least one mounting aperture 301. In this illustrative embodiment, the first circuit board 201 defines four mounting apertures. As shown above in FIG. 2, the interposer circuit board 203 defines four mounting apertures as well, with its mounting apertures being concentrically aligned with the four mounting apertures of the first circuit board 201. Similarly, in this illustrative embodiment the second circuit board defines four mounting apertures as well, with its mounting apertures being concentrically aligned with the four mounting apertures of the first circuit board 201.

In this illustrative embodiment, corresponding stacked mounting apertures are aligned around a single axis. For instance, the first circuit board 201 defines a first mounting aperture 301 having a central axis 302. The interposer circuit board 203 then defines a second mounting aperture while the second circuit board 202 defines a third mounting aperture. Each of the first mounting aperture, the second mounting aperture, and the third mounting aperture are concentrically aligned around the same central axis 302. A similar analysis can be applied to the other three mounting apertures of the first circuit board 201 and the corresponding mounting apertures defined by the interposer circuit board 203 and the second circuit board 202.

These mounting apertures allow a fastener, such as a screw, rivet, device housing component, or other feature, to pass through the mounting apertures to further mechanically retain the first circuit board 201, the interposer circuit board 203, and the second circuit board 202 together as a circuit board assembly 200. While soldering the one or more vias (214) to electrical contacts of the first circuit board 201 and second circuit board 202 that abut the one or more vias 214 provides a mechanical attachment, using fasteners through the mounting apertures makes the mechanical attachment between these layers more robust.

Figure 7:
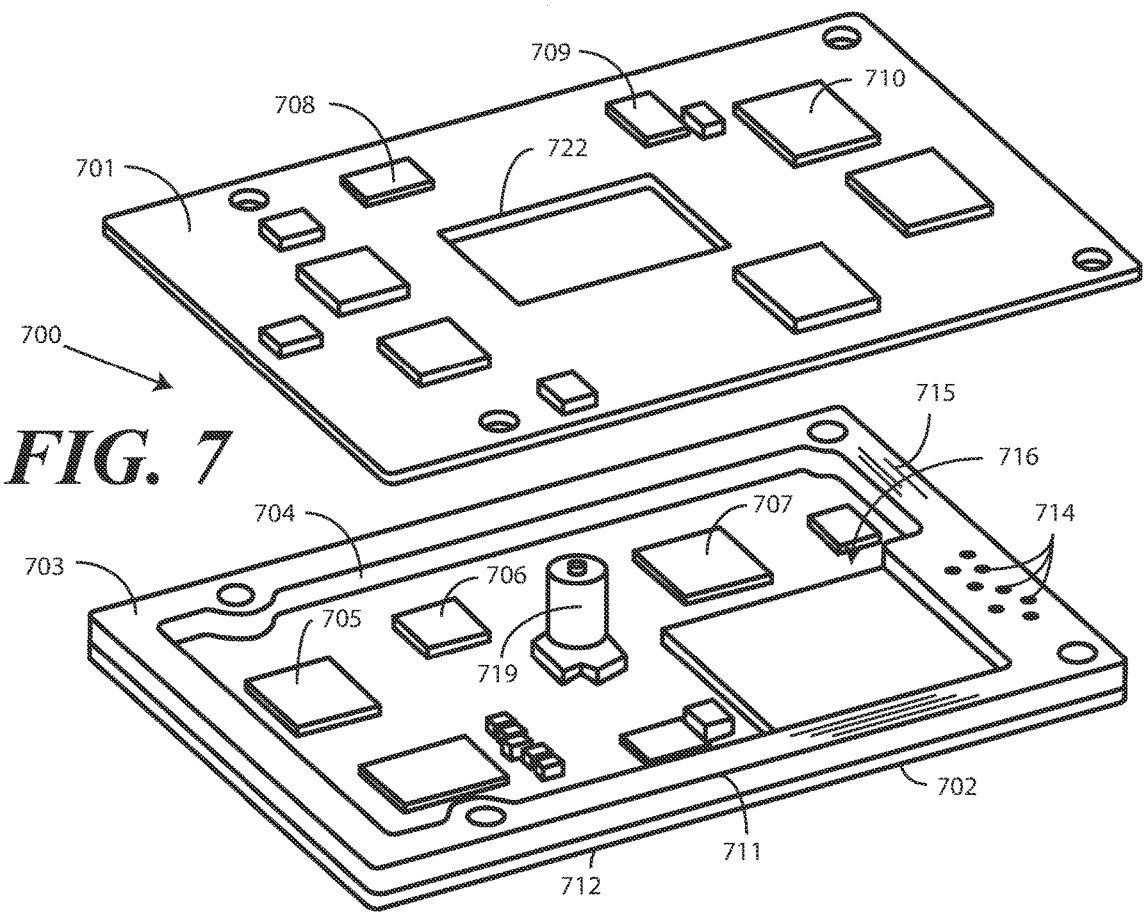
FIG. 7 illustrates another explanatory circuit board assembly in accordance with one or more embodiments of the disclosure in a partially assembled state.

Turning now to FIG. 7, illustrated therein is another explanatory circuit board assembly 700 configured in accordance with one or more embodiments of the disclosure. The circuit board assembly 700 of FIG. 7 is shown in a partially assembled configuration. The circuit board assembly 700 will be shown in an assembled configuration in FIG. 8.

As with the circuit board assembly (200) of FIGS. 2-3, the circuit board assembly 700 of FIG. 7 includes a first circuit board 701, a second circuit board 702, and an interposer circuit board 703. The interposer circuit board 703 defines a walled interface 704 and mechanically attaches and electrically couples the first circuit board 701 to the second circuit board 702. One or more electronic circuit components 705,706,707 can be positioned within the walled interface 704 and mechanically attached and electrically coupled to the first circuit board 701, the second circuit board 702, or combinations thereof. Illustrating by example, one or more electronic circuit components can be coupled to the bottom of the first circuit board 701 within the walled interface 704. As shown in FIG. 7, one or more embodiments electronic circuit components 705,706,707 can also be coupled to the second circuit board 702 within the walled interface 704 as well. In one or more embodiments, each of the first circuit board 701 and the second circuit board 702 have one or more electronic circuit components 705,706,707 arranged on their upper and lower major surfaces.

Each of the first circuit board 701, the second circuit board 702, and the interposer circuit board 703 can be configured as a printed wiring board manufactured from layers of a material such as fiberglass or FR4, with one or more conductive layers positioned therebetween. Each of the first circuit board 701, second circuit board 702, and interposer circuit board 703 can be rigid, flexible, or combinations thereof as previously described.

In the illustrative embodiment of FIG. 7, the interposer circuit board 703 is positioned between the first circuit board 701 and the second circuit board 702 and electrically couples the electronic circuit components 708,709,710 attached to the first circuit board 701 to the electronic circuit components 705,706,707 attached to the second circuit board 702. The walled interface 704 defines a cavity within the interposer circuit board 703 where electronic circuit components 705,706,707 can be positioned. In one or more embodiments, the interposer circuit board 703 comprises a copper clad laminate structure including a plurality of pre-impregnated material layers such as insulating fiberglass or resin layers with conductive layers disposed therebetween.

In the illustrative embodiment of FIG. 7, the interposer circuit board 703 passes along an entirety of the outer perimeter of the first circuit board 701 and the second circuit board 702. Said differently, the interposer circuit board 703 has an exterior perimeter 711 that is equal to the exterior perimeter 712 of the first circuit board 701 and the second circuit board 702. The interposer circuit board 703 of this illustrative embodiment is configured as a closed loop so as to define an aperture 722 that is bounded by the interior surface of the walled interface 704, which defines an aperture perimeter 716 of the interposer circuit board 703. In one or more embodiments, the interposer circuit board 703 defines one or more vias 714 and/or electrical traces 715 that electrically couple the first circuit board 701 to the second circuit board 702 between the exterior perimeter 711 and the aperture perimeter 716.

The vias 714 electrically connect electrical contacts abutting opposite surfaces of the interposer circuit board 703. When these electrical contacts are electrically coupled to the electronic circuit components 708,709,710 coupled to the first circuit board 701 and the electronic circuit components 705,706,707 coupled to the second circuit board 702, the vias 714 can couple those electronic circuit components 705,706,707,708,709,710 together through the interposer circuit board 703. In other embodiments, additional electrical contacts (not shown) can electrically couple the first circuit board 701 and second circuit board 702 together.

In the illustrative embodiment of FIG. 7, all terminal edges of both the first circuit board 701 and the second circuit board 702 terminate at the exterior perimeter 711 of the interposer circuit board 703. While this is one explanatory embodiment, in other embodiments the first circuit board 701 and/or second circuit board 702 will have one or more first circuit board extensions and/or second circuit board extensions that extend beyond the exterior perimeter 711 of the interposer circuit board 703.

In this illustrative embodiment, the first circuit board 701 defines an interface component aperture 722. An electronic circuit interface component 719 is positioned within the walled interface 704 of the interposer circuit board 703 and is mechanically attached to the second circuit board 702 within the walled interface 704. In this illustrative embodiment, the electronic circuit interface component 719 is also electrically coupled to the one or more electronic circuit components 705,706,707 coupled to the second circuit board 702.

Figure 8:
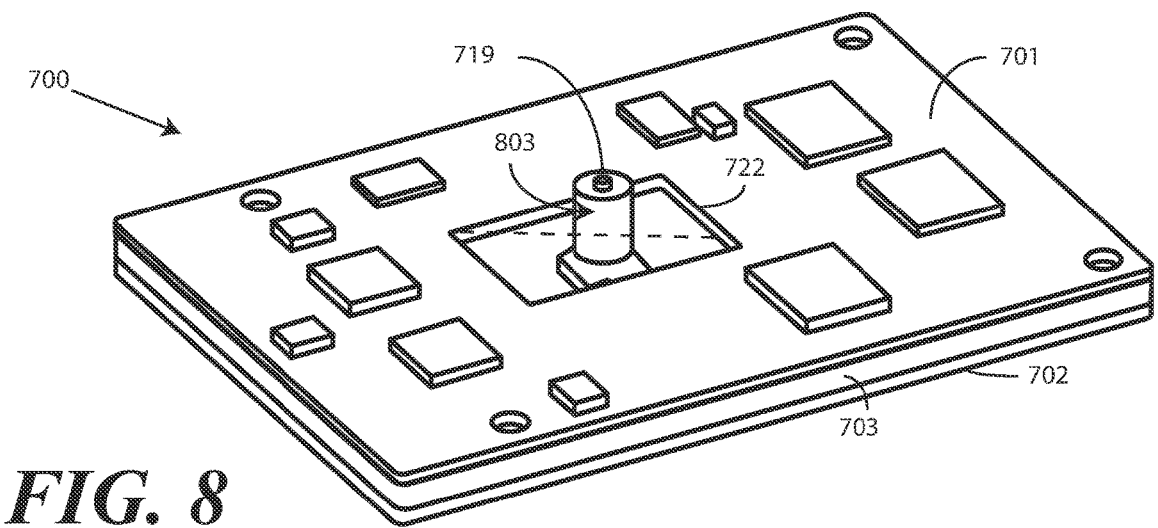
FIG. 8 illustrates the circuit board assembly of FIG. 7 in an assembled state.

Turning now to FIG. 8, when the circuit board assembly 700 is assembled, at least a portion 803 of the electronic circuit interface component 719 extends from the second circuit board 702 through the interface component aperture 722 of the first circuit board 701. As shown in FIG. 8, the interposer circuit board 703 mechanically attaches the first circuit board 701 to the second circuit board 702.

As before, the first circuit board 701 defines four mounting apertures. The interposer circuit board 703 defines four mounting corresponding and collocated apertures as well, with its mounting apertures being concentrically aligned with the four mounting apertures of the first circuit board 701. Similarly, the second circuit board 702 defines four mounting apertures as well, with its mounting apertures being concentrically aligned with the four mounting apertures of the first circuit board 701. These mounting apertures allow a fastener, such as a screw, rivet, device housing component, or other feature, to pass through the mounting apertures to further mechanically retain the first circuit board 701, the interposer circuit board 703, and the second circuit board 702 together as a circuit board assembly 700 as previously described.

While shown as a switch in FIGS. 7-8, the electronic circuit interface component 719 can take various forms. Turning now to FIGS. 9-11, illustrated therein are several examples. Others will be obvious to those of ordinary skill in the art having the benefit of this disclosure.

Beginning with FIG. 9, in this sectional view a switch 900 is mechanically attached to a first circuit board 901 within the walled interface 911 of an interposer circuit board 903 positioned between the first circuit board 901 and a second circuit board 902. The switch 900 is electrically coupled to one or more electronic circuit components 905,906,907,908, 909,910 coupled to one or both of the first circuit board 901 and/or the second circuit board 902. The switch 900 has an actuator 923 that at least partially extends through the interface component aperture 922 of the second circuit board 902. This provides access to the actuator 923 despite the fact that the switch 900 is positioned between the walled interface 911 of the interposer circuit board 903 and the first circuit board 901 and second circuit board 902.

Turning now to FIG. 10, in this sectional view a spring contact 1000 is mechanically attached to a first circuit board 901 within the walled interface 911 of an interposer circuit board 903 positioned between the first circuit board 901 and a second circuit board 902. The spring contact 1000 is electrically coupled to one or more electronic circuit components 905,906,907,908,909,910 coupled to one or both of the first circuit board 901 and/or the second circuit board 902.

The spring contact 1000 has an actuator 1023 that at least partially extends through the interface component aperture 922 of the second circuit board 902. This provides access to the actuator 1023 despite the fact that the spring contact 1000 is positioned between the walled interface 911 of the interposer circuit board 903 and the first circuit board 901 and second circuit board 902. Illustrating by example, in one or more embodiments an electronic device such as the electronic device (100) of FIG. 1 includes a device housing cover 1001. In one or more embodiments, to actuate the circuit board assembly, the actuator 1023 is biased against and interior surface of the device housing cover 1001 when the circuit board assembly is positioned within the device housing.

Turning now to FIG. 11, in this sectional view a connector 1100 is mechanically attached to a first circuit board 901 within the walled interface 911 of an interposer circuit board 903 positioned between the first circuit board 901 and a second circuit board 902. The connector 1100 is electrically coupled to one or more electronic circuit components 905, 906,907,908,909,910 coupled to one or both of the first circuit board 901 and/or the second circuit board 902. The electrical connector 1100 has one or more electrical contacts 1123 that at least partially extend through the interface component aperture 922 of the second circuit board 902. These electrical contacts 1123 are therefore exposed through the interface component aperture 922. This provides access to the electrical contacts 1123 despite the fact that the electrical connector 1100 is positioned between the walled interface 911 of the interposer circuit board 903 and the first circuit board 901 and second circuit board 902.

With the basic understanding of embodiments of the disclosure now in hand from the discussion of the generalized diagrams described above, attention will turn to more specific examples of circuit board assemblies configured in accordance with embodiments of the disclosure. As with the examples described above in FIGS. 2-3 and 7-8, any of these examples can be used in conjunction with the electronic device (100) of FIG. 1, with the corresponding circuit board assembly being positioned within the device housing (103) of the electronic device (100) to support the components described with reference to the schematic block diagram (102) to provide device functionality.

Figure 12:
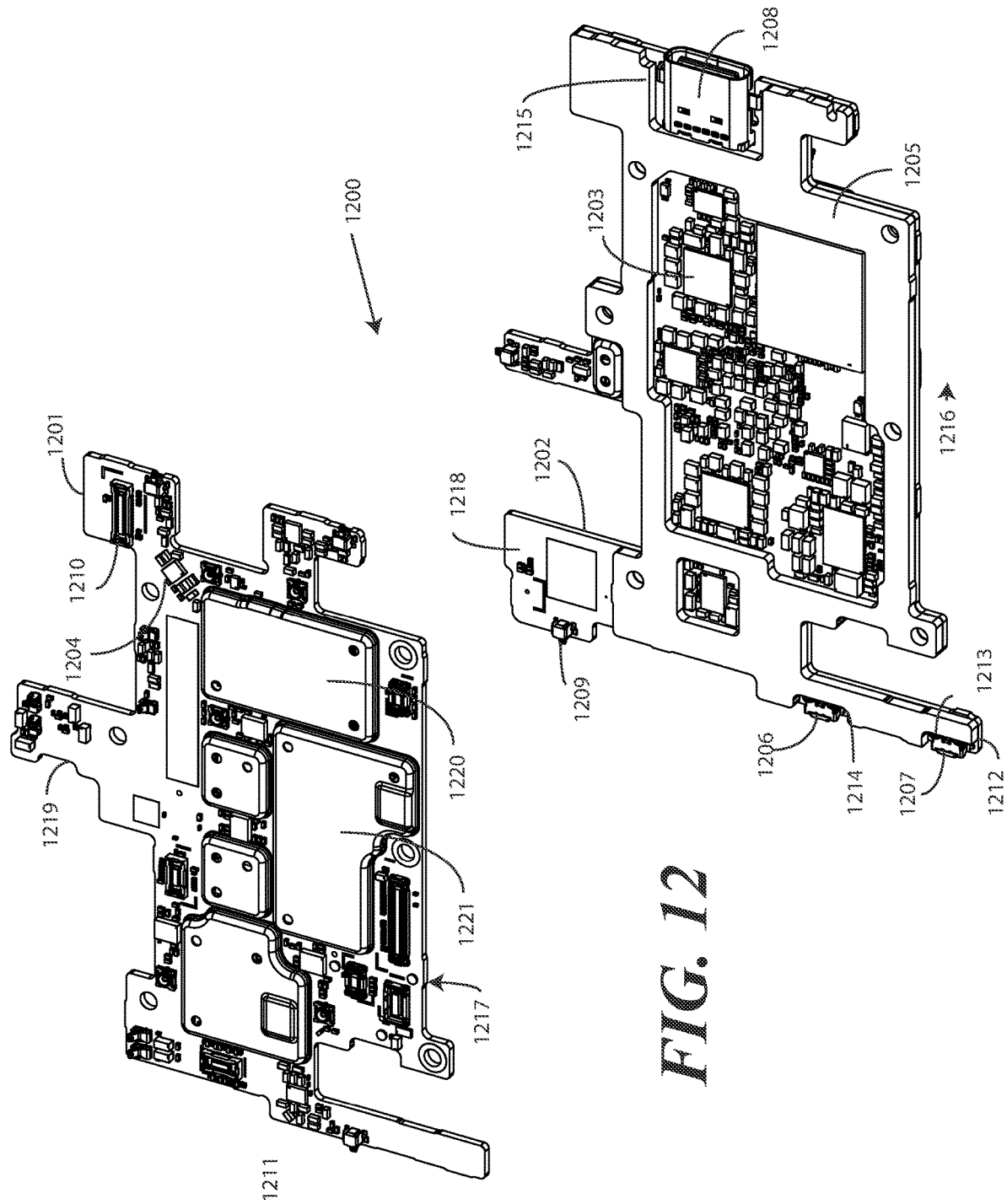
FIG. 12 illustrates still another explanatory circuit board assembly in accordance with one or more embodiments of the disclosure in a partially assembled state.

Beginning with FIG. 12, illustrated therein is a circuit board assembly 1200 for an electronic device that includes a first circuit board 1201 and a second circuit board 1202. Electronic components 1203,1204 are coupled to the first circuit board 1201 and the second circuit board 1202. Electromagnetic shields 1220,1221 can be placed atop some of the electronic components to shield the same from electromagnetic fields.

An interposer circuit board 1205 electrically couples the first circuit board to the second circuit board. The interposer circuit board 1205 defines an interposer circuit board perimeter 1212. As shown in FIG. 12, some portions of the first circuit board 1201 and the second circuit board 1202, e.g., portion 1216 and portion 1217, terminate at the exterior perimeter 1212 of the interposer circuit board 1205 while other portions of the first circuit board 1201 and the second circuit board 1202, e.g., portion 1218 and portion 1219, extend beyond the exterior perimeter 1212 of the interposer circuit board 1205. In this illustrative embodiment, the interposer circuit board 1205 surrounds at least some of the electronic components 1203 coupled to the second circuit board 1202.

One or more electronic circuit interface components are coupled to the first circuit board 1201 and the second circuit board 1202. Examples of these electronic circuit interface components shown in FIG. 12 include switches 1206,1207 coupled to the second circuit board 1202, a connector 1208 coupled to the second circuit board 1202, a spring contact 1209 coupled to the second circuit board 1202, another spring contact 1211 coupled to the first circuit board 1201, and another connector 1210 coupled to the first circuit board 1201. Via electronic traces passing beneath—or through— the interposer circuit board 1205, the switches 1206,1207, connector 1208, and spring contact 1209 are electrically coupled to one or both of the electronic components 1203 coupled to the second circuit board and/or the electronic components 1204 coupled to the first circuit board 1201.

In this illustrative embodiment, the switches 1206, 1207 and the connector 1208 are each coupled to second circuit board extensions of the second circuit board 1202 that extend distally beyond an exterior perimeter 1212 of the interposer circuit board 1205. More particularly, in this embodiment the perimeter 1212 of the interposer circuit board 1205 defines one or more recesses within which the electronic circuit interface components can situated.

Illustrating by example, the perimeter 1212 of the interposer circuit board 1205 defines an L-shaped recess 1213 into which switch 1207 is situated and peninsular recesses 1214,1215 into which switch 1206 and the connector 1208 are situated, respectively. Said differently, in one or more embodiments the electronic circuit interface components, e.g., switch 1207, and connector 1208, are situated within peninsular recesses 1214,1215 defined by the exterior perimeter 1212 of the interposer circuit board 1205. While the spring contact 1209 is shown being positioned on a second circuit board extension that extends beyond the exterior perimeter 1212 of the interposer circuit board 1205 in this illustrative embodiment, the spring contact 1209 could be positioned in either an L-shaped recess 1213 or a peninsular recess 1214 in other embodiments.

Figure 13:
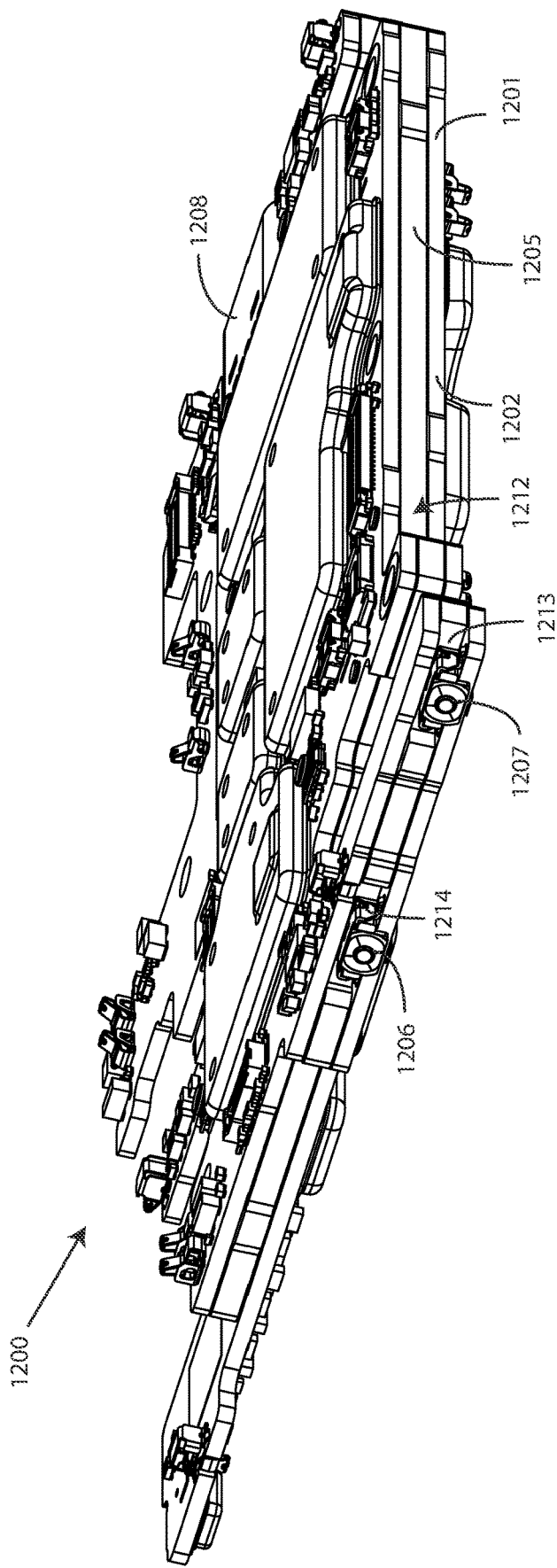
FIGS. 13-16 illustrate the circuit board assembly of FIG. 12 in an assembled state.
Figure 14:
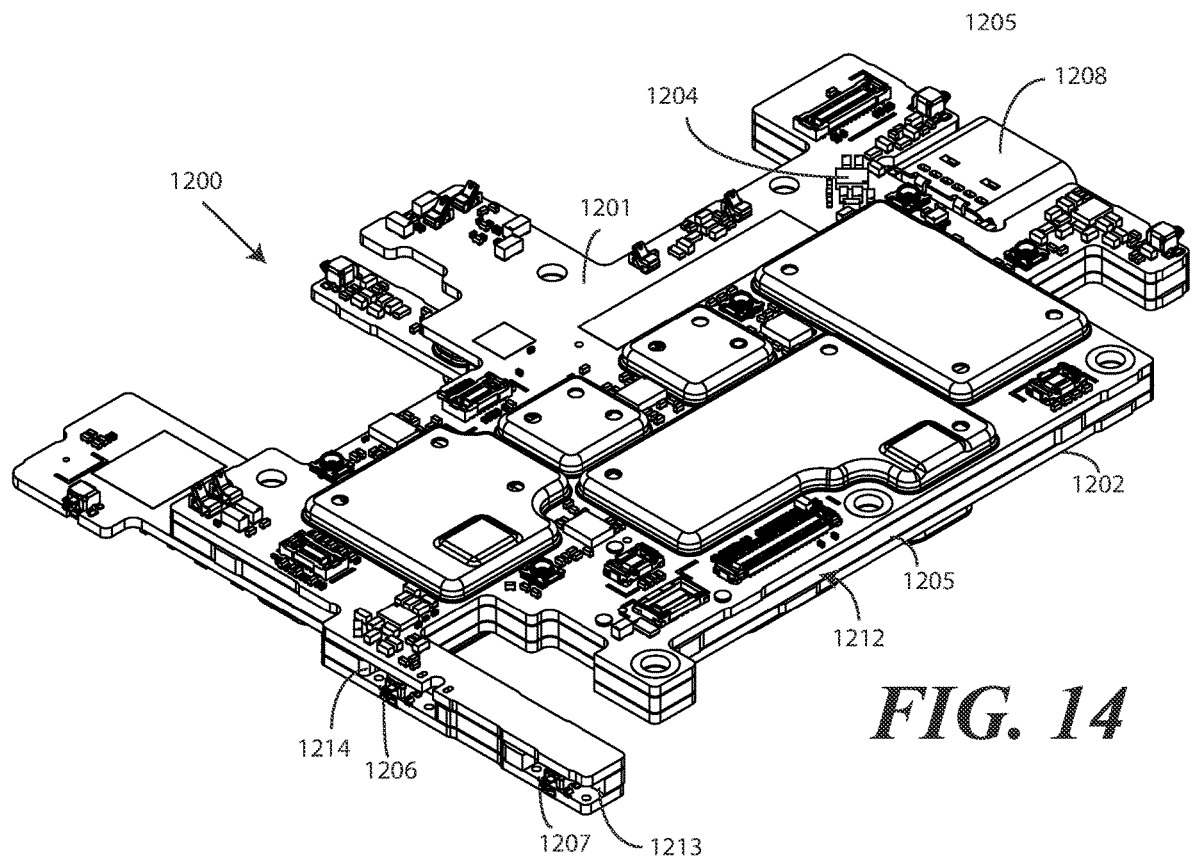

Turning now to FIGS. 13-14, illustrated therein are two perspective views of the circuit board assembly 1200 of FIG. 12 when the first circuit board 1201 is attached to the interposer circuit board 1205 such that the electronic components (1203),1204 and electronic circuit interface components can be electrically coupled together through conductive traces passing along the first circuit board 1201 and/or second circuit board 1202 and/or through the interposer circuit board 1205. As shown in these figures, switch 1206 is situated within a peninsular recess 1214 defined by the exterior perimeter 1212 of the interposer circuit board 1205 and between a first circuit board extension passing above the rear portion of the switch 1206 and a second circuit board extension passing beneath the rear portion of the switch 1206. However, another portion of switch 1206, namely, the push button portion, extends beyond terminal edges of the first circuit board 1201 and the second circuit board 1202, thereby allowing access to the push button so that it can be actuated when the circuit board assembly 1200 is assembled.

Similarly, switch 1207 is situated within an L-shaped recess 1213 defined by the exterior perimeter 1212 of the interposer circuit board 1205 and between a first circuit board extension passing above the rear portion of the switch 1207 and a second circuit board extension passing beneath the rear portion of the switch 1207. However, another portion of switch 1206, namely, the push button portion, extends beyond terminal edges of the first circuit board 1201 and the second circuit board 1202, thereby allowing access to the push button so that it can be actuated when the circuit board assembly 1200 is assembled. In sum, the positioning of switch 1206 and switch 1207 positions each electronic circuit interface component between a first circuit board extension and a second circuit board extension each extending beyond the perimeter 1212 of the interposer circuit board 1205 with portions of each electronic circuit interface component extending beyond terminal edges of the first circuit board 1201 and the second circuit board 1202.

Figure 15:
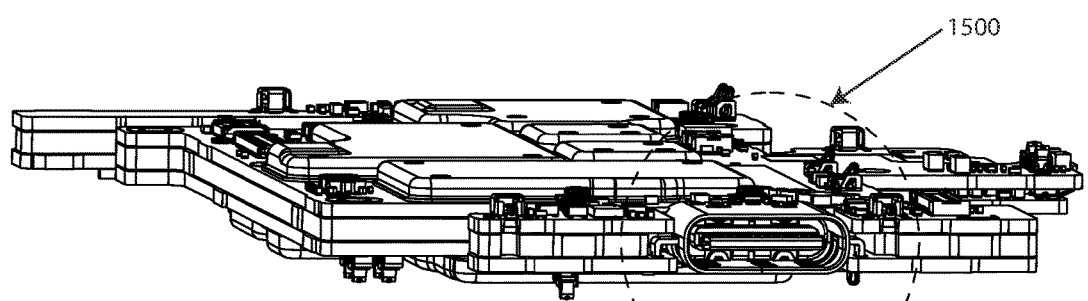
Figure 16:
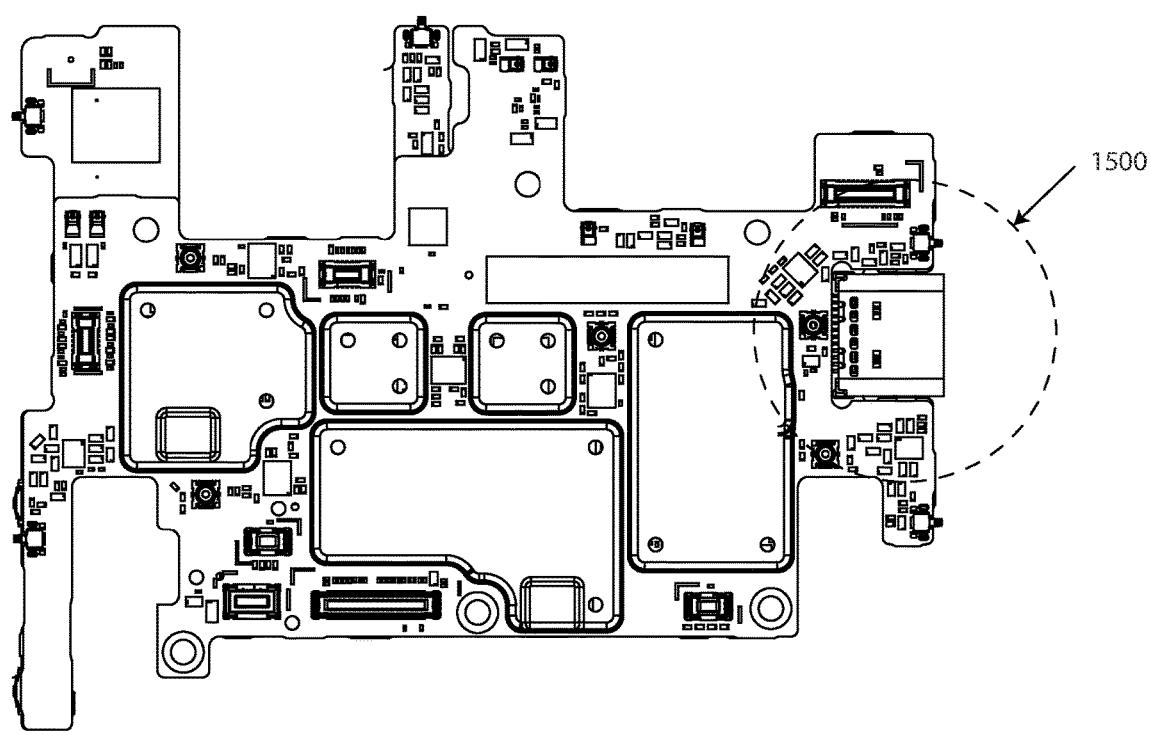
Figure 17:
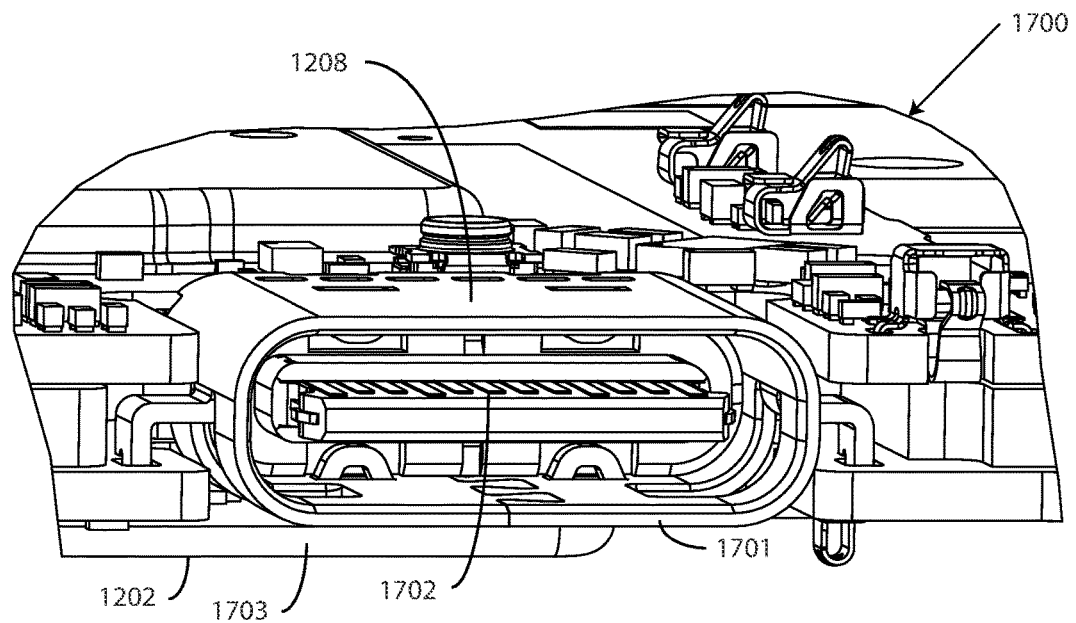
FIG. 17 illustrates portion of the circuit board assembly of FIG. 12.

Meanwhile, connector 1208 is situated within a peninsular recess 1215 with no first circuit board extension passing atop it due to its height. However, a portion of the connector 1208 extends beyond a terminal edge of the second circuit board 1202 so that its electrical contacts can be accessed without interference. FIGS. 15 and 16 define an area 1500 that is shown in an enlarged view 1700 in FIG. 17 depicting this fact. As shown in FIG. 17, the outer sheath 1701 of the connector 1208 and the electrical contacts 1702 of the connector 1208 each extend beyond a terminal edge 1703 of the first circuit board 1201.

Figure 18:
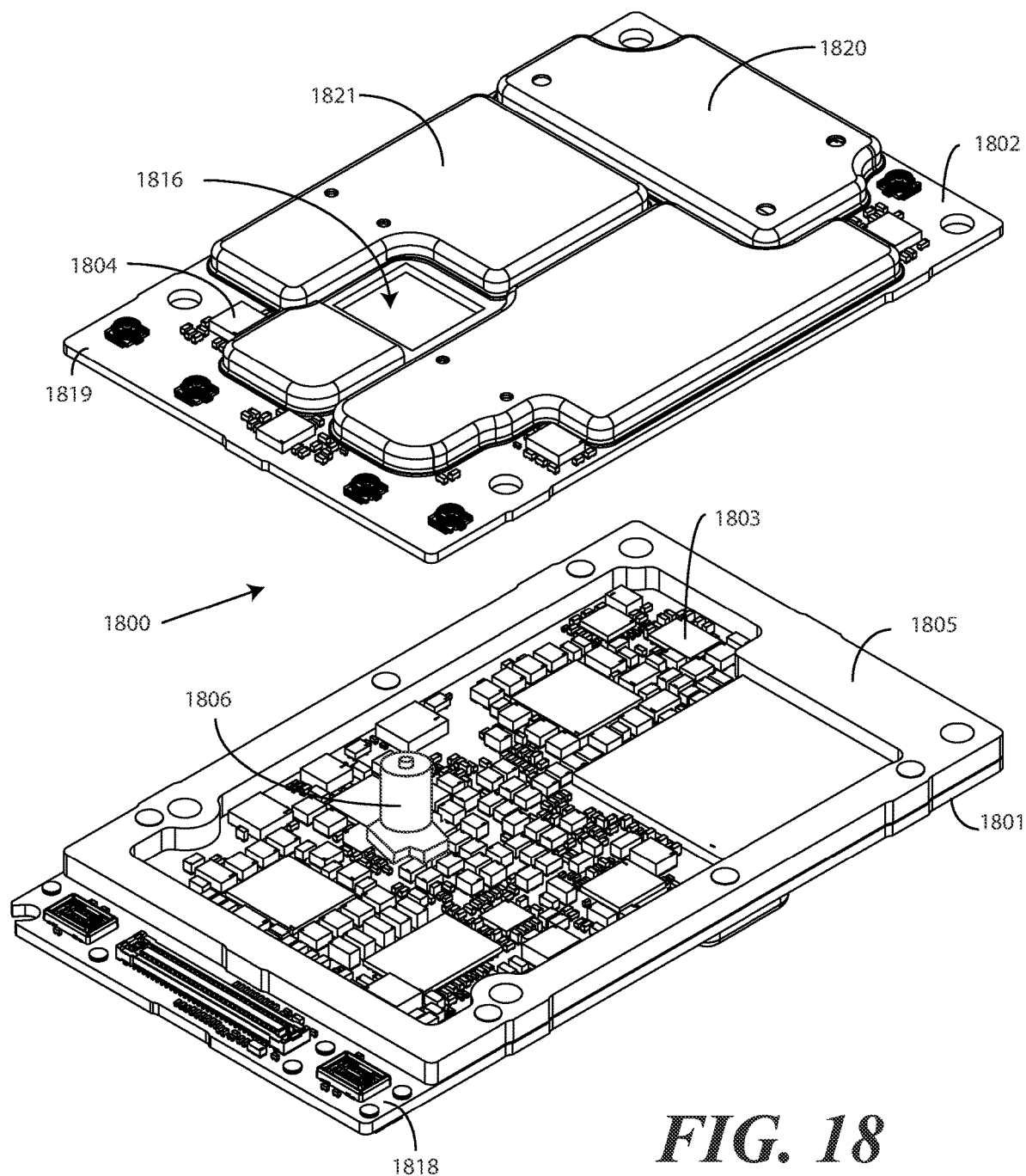
FIG. 18 illustrates yet another explanatory circuit board assembly in accordance with one or more embodiments of the disclosure in a partially assembled state.
Figure 19:
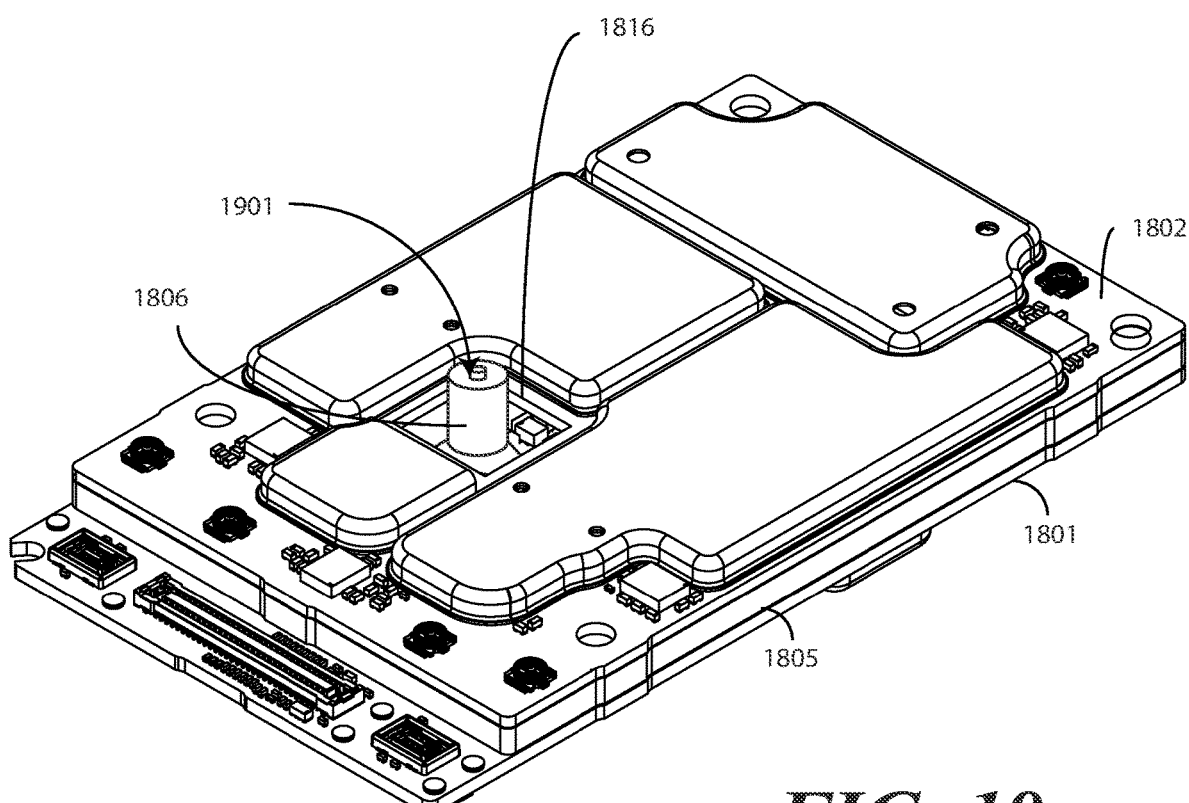
FIG. 19 illustrates the circuit board assembly of FIG. 18 in an assembled state.

Turning now to FIGS. 18-19, illustrated therein is another circuit board assembly 1800 configured in accordance with embodiments of the disclosure. As with other embodiments, the circuit board assembly 1800 includes a first circuit board 1801 and a second circuit board 1802. Electronic components 1803,1804 are coupled to the first circuit board 1201 and the second circuit board 1202. Electromagnetic shields 1820,1821 can be placed atop some of the electronic components to shield the same from electromagnetic fields.

An interposer circuit board 1805 electrically couples the first circuit board 1801 to the second circuit board 1802. In this illustrative embodiment, the interposer circuit board 1805 surrounds both the electronic components 1803 coupled to the first circuit board 1801 and an electronic circuit interface component 1806 coupled to the first circuit board 1801. In one or more embodiments, the electronic circuit interface component 1806 comprises an electrical connector that is electrically coupled to the electronic components 1803,1804. In another embodiment, the electronic circuit interface component 1806 comprises an electrical connector that is electrically coupled to the electronic components 1803,1804. In still other embodiments, the electronic circuit interface component 1806 comprises a spring contact that is electrically coupled to the electronic components 1803,1804. Other examples of electronic circuit interface components will be obvious to those of ordinary skill in the art having the benefit of this disclosure.

The interposer circuit board 1805 also defines an interposer circuit board perimeter 1812. As shown in FIG. 18, a portion 1818 of the first circuit board 1801 and a portion 1819 of the second circuit board 1802 extend beyond the exterior perimeter 1812 of the interposer circuit board 1805. However, the other three terminal edges of the first circuit board 1801 and the second circuit board 1802 terminate at the exterior perimeter 1812 of the interposer circuit board 1805.

In this illustrative embodiment, the second circuit board 1802 defines an aperture 1816. As shown in FIG. 19, when the first circuit board 1801, the interposer circuit board 1805, and the second circuit board 1802 are coupled together, at least a portion 1901 of the electronic circuit interface component 806 extends from the first circuit board 1801 through the aperture 1816. This allows the portion 1901 of the electronic circuit interface component 1806 to be accessible from atop the circuit board assembly 1800.

Figure 20:
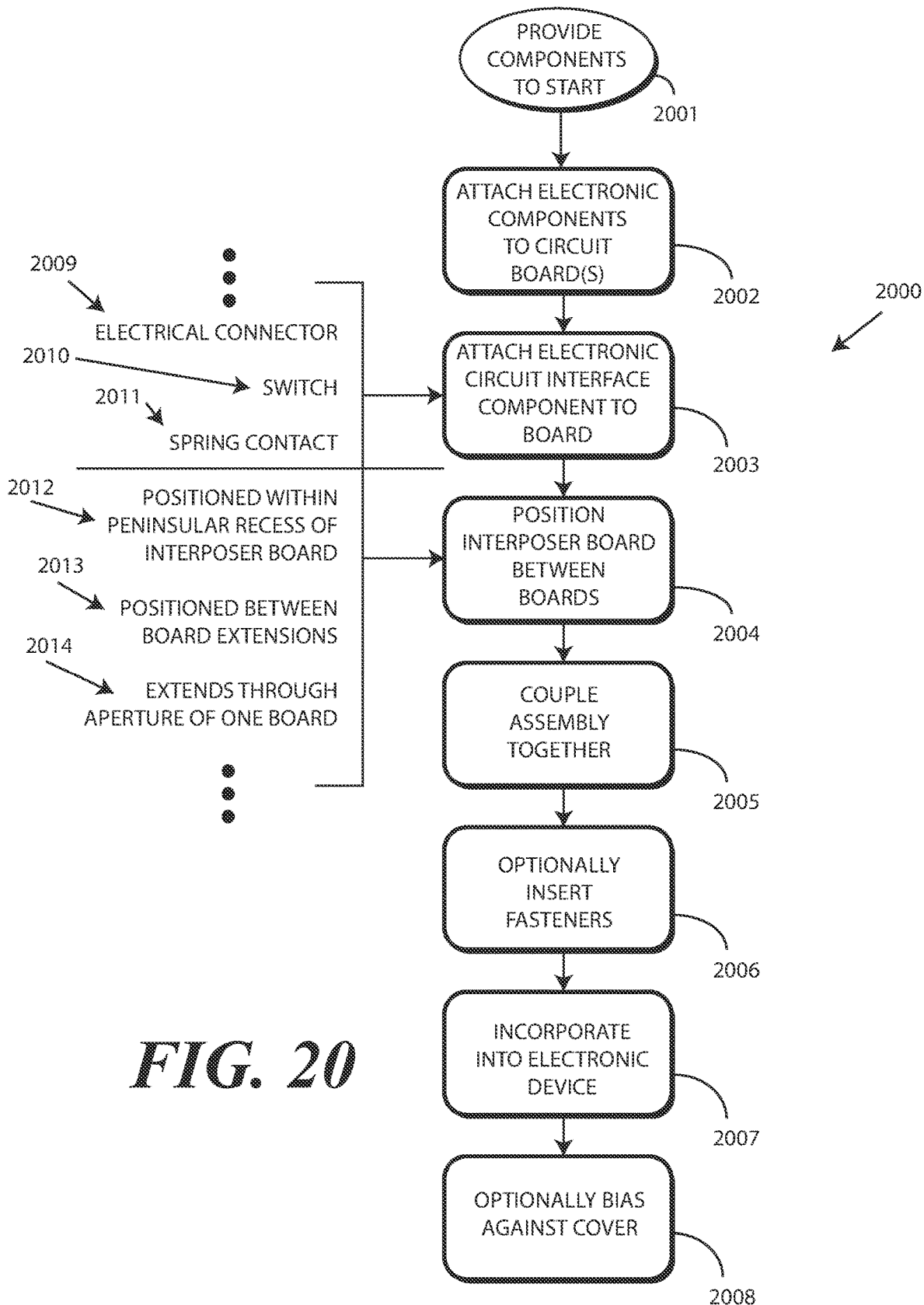
FIG. 20 illustrates one explanatory method in accordance with one or more embodiments of the disclosure.

Turning now to FIG. 20, illustrated therein is one explanatory method 2000 for constructing a circuit board assembly and corresponding electronic device in accordance with one or more embodiments of the disclosure. Beginning at stage 2001, components for this construction are provided. In one or more embodiments, these components include one or more embodiments electronic circuit components, a first circuit board, a second circuit board, an interposer circuit board, and at least one electronic circuit interface component. Other device components can be provided as well, including a device housing, a fascia covering the device housing, a display, and other components described above with reference to FIG. 1.

At step 2002, the method 2000 attaches one or more embodiments electronic circuit components to one or more of the first circuit board and/or the second circuit board. At step 2003, the method 2000 attaches at least one electronic circuit interface component to at least one of the first circuit board and/or the second circuit board.

As shown in FIG. 20, the electronic circuit interface component can take different forms. In one or more embodiments, the electronic circuit interface component comprises an electrical connector 2009. In another embodiment, the electronic circuit interface component comprises a switch 2110. In still other embodiments, the electronic circuit interface component comprises a spring contact 2011. Other examples of electronic circuit interface components will be obvious to those of ordinary skill in the art having the benefit of this disclosure.

Step 2003 then comprises positioning an interposer circuit board between the first circuit board and the second circuit board. In one or more embodiments, this positioning results in the interposer circuit board surrounding the one or more electronic circuit components and defining a walled interface extending between the first circuit board and the second circuit board between the one or more embodiments electronic circuit components and the electronic circuit interface component. In other embodiments, this positioning results in the interposer circuit board surrounding both the one or more electronic circuit components and the electronic circuit interface component, defining a walled interface extending between the first circuit board and the second circuit board, and with at least a portion of the electronic circuit interface component extending distally from the first circuit board through an aperture defined by the second circuit board.

In one or more embodiments, the positioning of the interposer circuit board at step 2004 results in the electronic circuit interface component being positioned 2012 within a peninsular recess of the interposer circuit board. In one or more embodiments, this positioning of step 2004 results in the electronic circuit interface component being positioned 2013 between a first circuit board extension and a second circuit board extension that each extend distally beyond an exterior perimeter of the interposer circuit board.

Where the electronic circuit interface component is positioned within the walled interface of the interposer circuit board at step 2003, the positioning of the interposer circuit board at step 2004 results in at least a portion of the electronic circuit interface component extending 2014 through the aperture defined by the interposer circuit board. In one or more embodiments, this results in a switch actuator of the electronic circuit interface component extending 2014 through the aperture. In other embodiments, this results in one or more electrical contacts of an electrical connector extending 2014 through the aperture. Of course, electronic circuit interface components can be used in combination such that multiple portions of multiple electronic circuit interface component, respectively, extend through the aperture as well.

At step 2005, the method 2000 electrically and mechanically couples the first circuit board, the interposer circuit board, and the second circuit board, and therefore the electronic circuit components coupled to the first circuit board and/or second circuit board, together. In one or more embodiments, step 2005 occurs when a reflow process is performed to connect electrical contacts on the first circuit board and second circuit board, respectively, to via contacts on opposite sides of the interposer circuit board.

Step 2006 then optionally reinforces the mechanical connection by passing one or more embodiments fasteners through concentrically aligned apertures of the first circuit board, the second circuit board, and the interposer circuit board. Examples of such fasteners include screws, bolts, rivets, and mechanical features of device housings of electronic devices. Other examples of such fasteners will be obvious to those of ordinary skill in the art having the benefit of this disclosure.

Step 2007 then positions the circuit board assembly into an electronic device, one example of which was described above with reference to FIG. 1. As described above with reference to FIG. 10, in one or more embodiments optional step 2008 can comprise biasing a device housing cover against the at least a portion of the electronic circuit interface component that extends through the aperture of the second circuit board such that deflection of the device housing cover translates at least a portion of the electronic circuit interface component toward the first circuit board.

Figure 21:
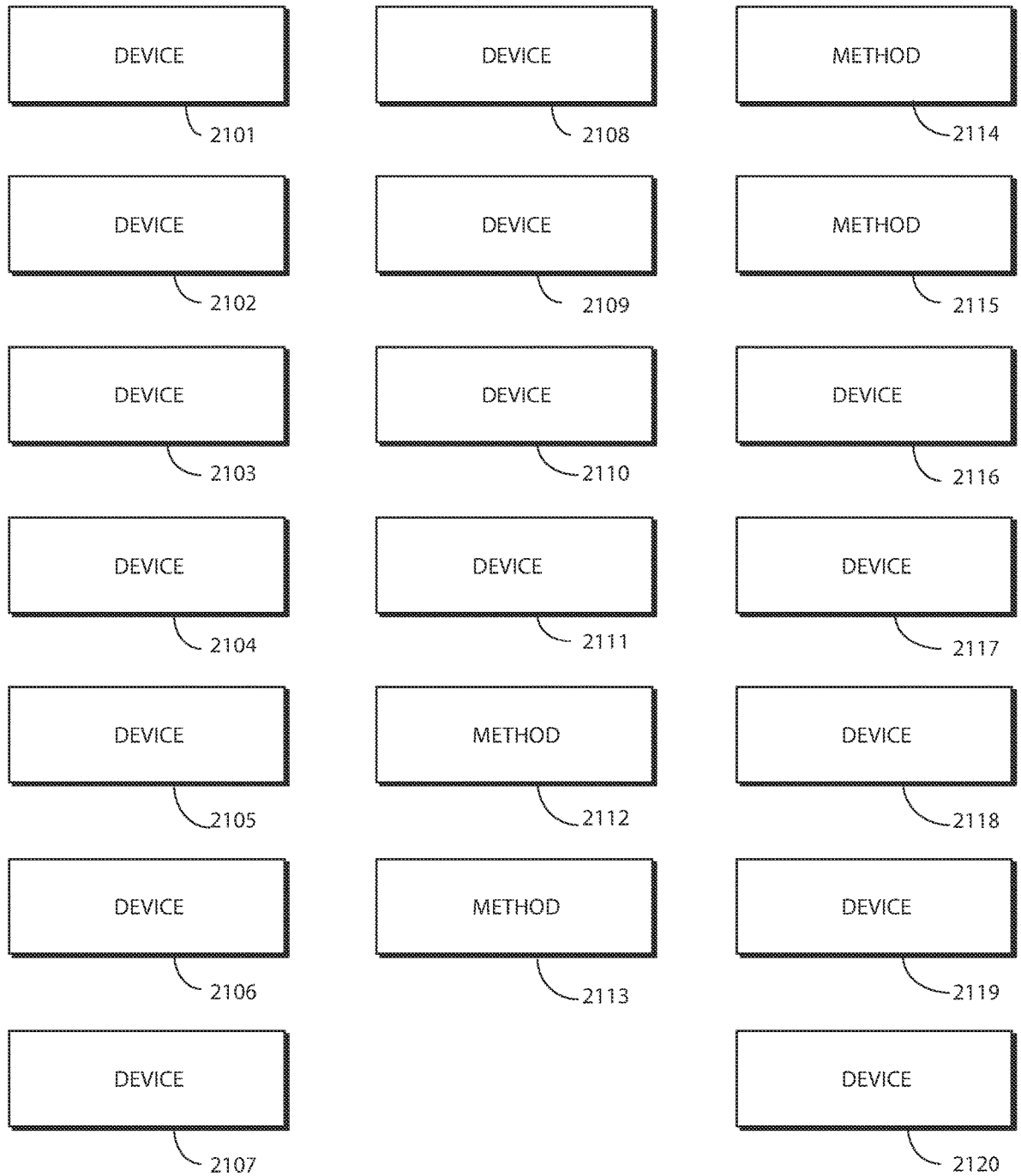
FIG. 21 illustrates various embodiments of the disclosure.
Figure 22:
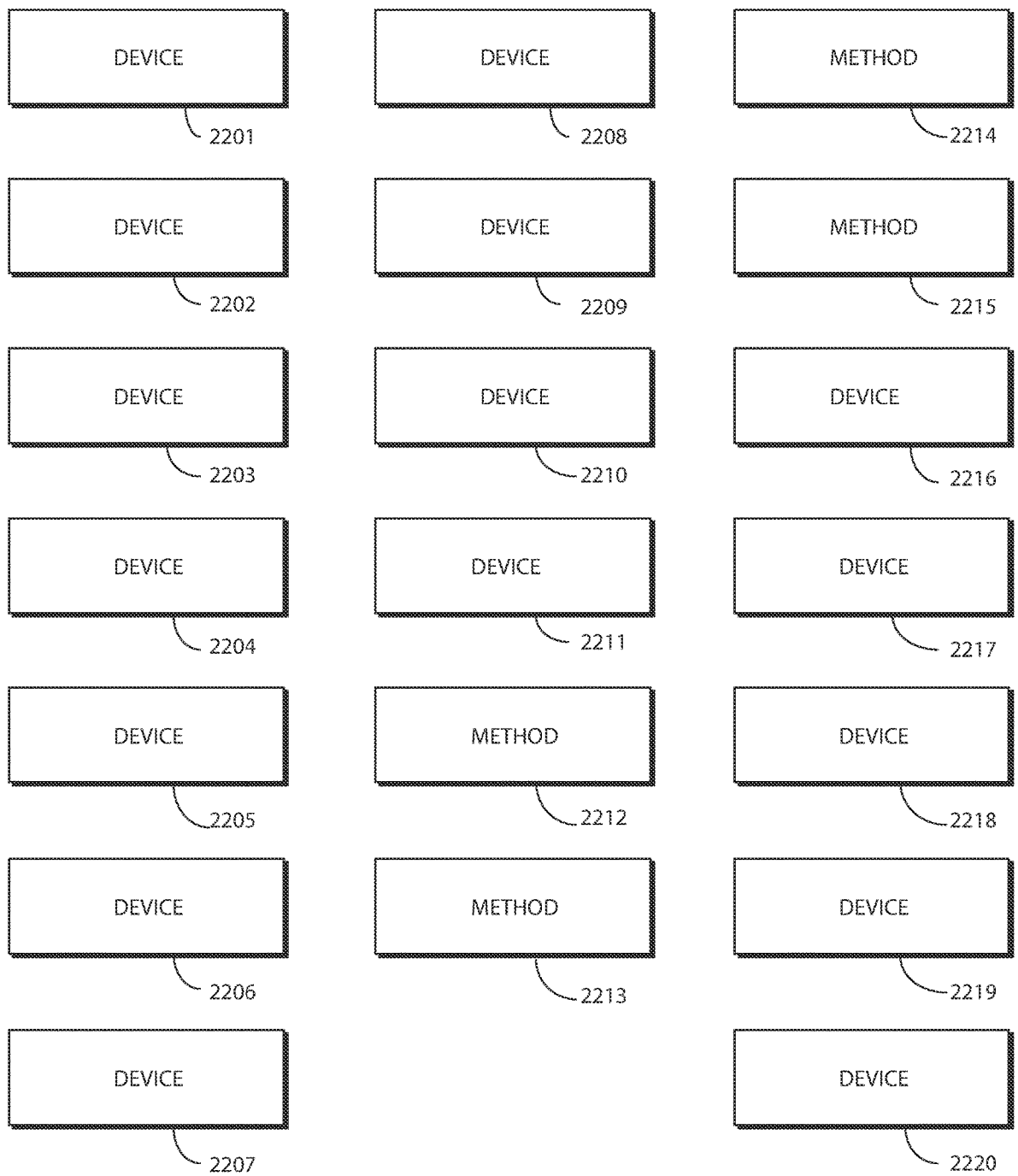
FIG. 22 illustrates various other embodiments of the disclosure.

Turning now to FIGS. 21 and 22, illustrated therein are various embodiments of the disclosure. The embodiments of FIGS. 21 and 22 are shown as labeled boxes in FIGS. 21-22 due to the fact that the individual components of these embodiments have been illustrated in detail in FIGS. 1-20, which precede FIGS. 21 and 22. Accordingly, since these items have previously been illustrated and described, their repeated illustration is no longer essential for a proper understanding of these embodiments. Thus, the embodiments are shown as labeled boxes.

At 2101, an electronic device comprises a first circuit board, a second circuit board, and an interposer circuit board defining a walled interface mechanically attaching the first circuit board to the second circuit board. At 2101, the electronic device comprises one or more electronic circuit components positioned within the walled interface and mechanically attached to one of the first circuit board or the second circuit board.

At 2101, the electronic device comprises an electronic circuit interface component mechanically attached to the first circuit board. At 2101, the electronic circuit interface component is attached to the first circuit board outside the walled interface of the interposer circuit board. At 2101, the electronic circuit interface component is electronically coupled to the one or more electronic circuit components.

At 2102, the electronic circuit interface component of 2101 comprises an electrical connector. At 2103, the electronic circuit interface component of 2101 comprises a switch. At 2104, the electronic circuit interface component of 2101 comprises a spring contact.

At 2105, the interposer circuit board of 2101 has an exterior perimeter. At 2105, the interposer circuit board defines an aperture having an aperture perimeter. At 2105, the interposer circuit board electrically couples the first circuit board to the second circuit board between the exterior perimeter and the aperture perimeter.

At 2106, some portions of the first circuit board and the second circuit board of 2105 terminate at the exterior perimeter of the interposer circuit board. At 2106, other portions of both the first circuit board and the second circuit board extend beyond the exterior perimeter of the interposer circuit board.

At 2107, the first circuit board of 2105 defines a first circuit board extension extending distally beyond the exterior perimeter of the interposer circuit board. At 2107, the second circuit board of 2105 defines a second circuit board extension extending distally beyond the exterior perimeter of the interposer circuit board. At 2107, the electronic circuit interface component of 2105 is positioned between the first circuit board extension and the second circuit board extension.

At 2108, the exterior perimeter of the interposer circuit board of 2107 defines a peninsular recess. At 2108, the electronic circuit interface component is situated within the peninsular recess.

At 2109, the first circuit board extension and the second circuit board extension of 2108 each extend the same distance from the exterior perimeter of the interposer circuit board. At 2110, the first circuit board of 2105 defines a first mounting aperture, while the interposer circuit board defines a second mounting aperture. At 2110, the second circuit board defines a third mounting aperture. At 2110, the first mounting aperture, the second mounting aperture, and the third mounting aperture are concentrically aligned around a single axis. At 2111, the electronic circuit interface component of 2101 of 2101 extends distally beyond a terminal edge of the first circuit board.

At 1212, a method comprises attaching one or more electronic circuit components to one or more of a first circuit board and/or a second circuit board. At 1212, the method comprises attaching an electronic circuit interface component to the first circuit board. At 1212, the method comprises electronically coupling the first circuit board to the second circuit board by positioning an interposer circuit board between the first circuit board and the second circuit board such that the interposer circuit board surrounds the one or more electronic circuit components and defines a walled interface extending between the first circuit board and the second circuit board between the one or more electronic circuit components and the electronic circuit interface component.

At 1213, the attaching of the electronic circuit interface component to the first circuit board at 1212 positions the electronic circuit interface component within a peninsular recess of the interposer circuit board. At 1214, the electrical coupling of the first circuit board to the second circuit board of 1212 positions the electronic circuit interface component between a first circuit board extension and a second circuit board extension each extending distally beyond an exterior perimeter of the interposer circuit board. At 1215, the method of 1212 further comprises mechanically coupling the first circuit board, the interposer circuit board, and the second circuit board together by passing a fastener through concentrically aligned apertures of the first circuit board, the second circuit board, and the interposer circuit board.

At 1216, an electronic device comprises a first circuit board and a second circuit board. At 1216, the electronic device comprises electronic components coupled to the first circuit board and the second circuit board.

At 1216, the electronic device comprises an interposer circuit board. At 1216, the interposer circuit board electrically couples the first circuit board to the second circuit board and surrounding the electronic components. At 1216, the electronic device comprises an electronic circuit interface component coupled to a first circuit board extension of the first circuit board that extends distally beyond an exterior perimeter of the interposer circuit board.

At 1217, the electronic circuit interface component of 1216 is situated within a peninsular recess defined by the exterior perimeter of the interposer circuit board and between the first circuit board extension and a second circuit board extension of the second circuit board that extends distally beyond the exterior perimeter of the interposer circuit board. At 1218, the electronic circuit interface component of 1217 is electrically coupled to the electronic components.

At 1219, the electronic circuit interface component of 1217 comprises a spring contact that is electrically coupled to the electronic components. At 1220, the electronic circuit interface component of 1217 comprises a switch that is electrically coupled to the electronic components.

Turning now to FIG. 22, at 2201 an electronic device comprises a first circuit board, a second circuit board defining an interface component aperture, and an interposer circuit board defining a walled interface mechanically attaching the first circuit board to the second circuit board. At 2201, the electronic device comprises one or more electronic circuit components positioned within the walled interface. At 2201, the one or more electronic circuit components are mechanically attached to one of the first circuit board or the second circuit board.

At 2201, the electronic device comprises an electronic circuit interface component mechanically attached to the first circuit board within the walled interface. At 2201, the electronic circuit interface component is electronically coupled to the one or more electronic circuit components. At 2201, at least a portion of the electronic circuit interface component extends from the first circuit board through the interface component aperture.

At 2202, the electronic circuit interface component of 2101 comprises an electrical connector having one or more electrical contacts that are exposed through the interface component aperture. At 2203, the electronic circuit interface component of 2101 comprises a switch having an actuator at least partially extending through the interface component aperture. At 2204, the electronic circuit interface component of 2101 comprises a spring contact having an actuator at least partially extending through the interface component aperture.

At 2205, the interposer circuit board of 2101 has an exterior perimeter. At 2205, the interposer circuit board defines an aperture having an aperture perimeter. At 2205, the interposer circuit board electrically couples the first circuit board to the second circuit board between the exterior perimeter and the aperture perimeter.

At 2206, the electronic device of 2505 further comprises a device housing cover. At 2206, the at least a portion of the electronic circuit interface component is biased against an interior surface of the device housing cover. At 2207, some portions of both the first circuit board and the second circuit board of 2205 terminate at the exterior perimeter of the interposer circuit board, while other portions of both the first circuit board and the second circuit board extend beyond the exterior perimeter of the interposer circuit board.

At 2208, the first circuit board of 2205 defines a first mounting aperture. At 2208, the interposer circuit board defining a second mounting aperture while the second circuit board defining a third mounting aperture. At 2208, the first mounting aperture, the second mounting aperture, and the third mounting aperture are concentrically aligned around a single axis.

At 2209, the electronic device of 2208 further comprises a fastener positioned within each of the first mounting aperture, the second mounting aperture, and the third mounting aperture. At 2209, the fastener mechanically couples the first circuit board, the interposer circuit board, and the second circuit board together.

At 2210, the interposer circuit board of 2201 defines one or more vias electrically coupling the first circuit board to the second circuit board. At 2211, one or both of the first circuit board and/or the second circuit board of 2201 define a circuit board extension extending distally beyond a perimeter of the interposer circuit board.

At 2212, a method comprises attaching one or more electronic circuit components to one or more of a first circuit board and/or a second circuit board. At 2212, the method comprises attaching an electronic circuit interface component to the first circuit board.

At 2212, the method comprises electronically coupling the first circuit board to the second circuit board by positioning an interposer circuit board between the first circuit board and the second circuit board. At 2212 this electronic coupling is such that the interposer circuit board surrounds both the one or more electronic circuit components and the electronic circuit interface component, the interposer circuit board defines a walled interface extending between the first circuit board and the second circuit board, and at least a portion of the electronic circuit interface component extends distally from the first circuit board through an aperture defined by the second circuit board.

At 2213, the electric coupling of the first circuit board to the first circuit board of 2212 results in a switch actuator of the electronic circuit interface component extending through the aperture defined by the second circuit board. At 2214, the electric coupling of the first circuit board to the first circuit board of 2212 results in one or more electrical contacts of an electrical connector being exposed through the aperture defined by the second circuit board. At 2215, the electric coupling of the first circuit board to the first circuit board of 2212 results in a spring actuator of a spring contact extending through the aperture defined by the second circuit board.

At 2216, the method of 2212 further comprises biasing a device housing cover against the at least a portion of the electronic circuit interface component. At 2216, the biasing is such that deflection of the device housing cover translates the at least a portion of the electronic circuit interface component toward the first circuit board.

At 2217, an electronic device comprises a first circuit board and a second circuit board. At 2217, the electronic device comprises electronic components coupled to the first circuit board and the second circuit board.

At 2217, the electronic device comprises an electronic circuit interface component coupled to the first circuit board. At 2217, the electronic device comprises an interposer circuit board surrounding both the electronic components and the electronic circuit interface component.

At 2217, the interposer circuit board electrically couples the first circuit board to the second circuit board and surrounding the electronic components. At 2217, at least a portion of the electronic circuit interface component extends from the first circuit board through an aperture defined by the second circuit board.

At 2218, the electronic circuit interface component of 2217 comprises an electrical connector that is electrically coupled to the electronic components. At 2219, the electronic circuit interface component of 2217 comprises a spring contact that is electrically coupled to the electronic components. At 2202, the electronic circuit interface component of 2217 comprises a switch that is electrically coupled to the electronic components.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims.

Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. An electronic device, comprising:
   a first circuit board;
   a second circuit board;
   an interposer circuit board defining a walled interface mechanically attaching the first circuit board to the second circuit board;
   one or more electronic circuit components positioned within the walled interface and mechanically attached to one of the first circuit board or the second circuit board; and
   an electronic circuit interface component mechanically attached to the first circuit board outside the walled interface and electronically coupled to the one or more electronic circuit components;
   wherein the interposer circuit board has an exterior perimeter and defining an aperture having an aperture perimeter, the interposer circuit board electrically coupling the first circuit board to the second circuit board between the exterior perimeter and the aperture perimeter.

2. The electronic device of claim 1, the electronic circuit interface component comprising an electrical connector.

3. The electronic device of claim 1, the electronic circuit interface component comprising a switch.

4. The electronic device of claim 1, the electronic circuit interface component comprising a spring contact.

5. The electronic device of claim 1, further comprising a fastener coupling the first circuit board to the second circuit board.

6. The electronic device of claim 1, wherein some portions of both the first circuit board and the second circuit board terminate at the exterior perimeter of the interposer circuit board and other portions of both the first circuit board and the second circuit board extend beyond the exterior perimeter of the interposer circuit board.

7. The electronic device of claim 1, the first circuit board defining a first circuit board extension extending distally beyond the exterior perimeter of the interposer circuit board, the second circuit board defining a second circuit board extension extending distally beyond the exterior perimeter of the interposer circuit board, wherein the electronic circuit interface component is positioned between the first circuit board extension and the second circuit board extension.

8. The electronic device of claim 7, wherein the exterior perimeter of the interposer circuit board defines a peninsular recess, wherein the electronic circuit interface component is situated within the peninsular recess.

9. The electronic device of claim 8, wherein the first circuit board extension and the second circuit board extension each extend the same distance from the exterior perimeter of the interposer circuit board.

10. The electronic device of claim 1, the first circuit board defining a first mounting aperture, the interposer circuit board defining a second mounting aperture, and the second circuit board defining a third mounting aperture, wherein the first mounting aperture, the second mounting aperture, and the third mounting aperture are concentrically aligned around a single axis.

11. The electronic device of claim 1, the electronic circuit interface component extending distally beyond a terminal edge of the first circuit board.

12. A method, comprising:
attaching one or more electronic circuit components to one or more of a first circuit board and/or a second circuit board;
attaching an electronic circuit interface component to the first circuit board;
electronically coupling the first circuit board to the second circuit board by positioning an interposer circuit board between the first circuit board and the second circuit board such that the interposer circuit board surrounds the one or more electronic circuit components and defines a walled interface extending between the first circuit board and the second circuit board between the one or more electronic circuit components and the electronic circuit interface component; and
mechanically coupling the first circuit board, the interposer circuit board, and the second circuit board together by passing a fastener through concentrically aligned apertures of the first circuit board, the second circuit board, and the interposer circuit board.

13. The method of claim 12, wherein the attaching the electronic circuit interface component to the first circuit board positions the electronic circuit interface component within a peninsular recess of the interposer circuit board.

14. The method of claim 12, wherein the electrically coupling the first circuit board to the second circuit board positions the electronic circuit interface component between a first circuit board extension and a second circuit board extension each extending distally beyond an exterior perimeter of the interposer circuit board.

15. The method of claim 12, wherein the fastener comprises one of a screw, rivet, or device housing component.

16. An electronic device, comprising:
a first circuit board and a second circuit board;
electronic components coupled to the first circuit board and the second circuit board;
an interposer circuit board electrically coupling the first circuit board to the second circuit board and surrounding the electronic components; and
an electronic circuit interface component coupled to a first circuit board extension of the first circuit board that extends distally beyond an exterior perimeter of the interposer circuit board;
wherein the electronic circuit interface component comprises at least one of an electrical connector, a switch, and/or a spring contact.

17. The electronic device of claim 16, wherein the electronic circuit interface component is situated within a peninsular recess defined by the exterior perimeter of the interposer circuit board and between the first circuit board extension and a second circuit board extension of the second circuit board that extends distally beyond the exterior perimeter of the interposer circuit board.

18. The electronic device of claim 17, wherein the electronic circuit interface component comprises the electrical connector, and is electrically coupled to the electronic components.

19. The electronic device of claim 17, wherein the electronic circuit interface component comprises the spring contact, and is electrically coupled to the electronic components.

20. The electronic device of claim 17, wherein the electronic circuit interface component comprises the switch, and is electrically coupled to the electronic components.

* * * * *